United States Patent
Yamada

(10) Patent No.: US 9,689,916 B2
(45) Date of Patent: Jun. 27, 2017

(54) METHOD FOR DETERMINING SET VALUE OF PRESSURE FOR INSPECTION IN WAFER INSPECTION APPARATUS

(71) Applicant: TOKYO ELECTRON LIMITED, Tokyo (JP)

(72) Inventor: Hiroshi Yamada, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 111 days.

(21) Appl. No.: 14/848,765

(22) Filed: Sep. 9, 2015

(65) Prior Publication Data

US 2016/0069951 A1   Mar. 10, 2016

(30) Foreign Application Priority Data

Sep. 9, 2014 (JP) ................................. 2014-182897

(51) Int. Cl.
G01R 31/00 (2006.01)
G01R 31/28 (2006.01)

(52) U.S. Cl.
CPC ................................. *G01R 31/2891* (2013.01)

(58) Field of Classification Search
CPC .................................................. G01R 31/2891
USPC ........................... 324/750.2, 750.22, 754.08, 324/756.01–756.03, 757.01–757.05
See application file for complete search history.

(56) References Cited

U.S. PATENT DOCUMENTS

| | | | | |
|---|---|---|---|---|
| 7,068,056 B1 * | 6/2006 | Gibbs | ................ | G01R 31/2891 324/750.16 |
| 2009/0021275 A1 * | 1/2009 | Kanev | ................ | G01R 31/2891 324/756.03 |
| 2013/0323864 A1 * | 12/2013 | Mo | ........................ | H01L 22/14 438/17 |
| 2014/0118018 A1 * | 5/2014 | Washio | .............. | G01R 31/2887 324/756.03 |
| 2016/0003897 A1 * | 1/2016 | Kupniewski | ....... | G01R 31/2891 324/750.2 |

FOREIGN PATENT DOCUMENTS

JP       2002-22768       1/2002

* cited by examiner

*Primary Examiner* — Jermele M Hollington
*Assistant Examiner* — Demetrius Pretlow

(57) ABSTRACT

In a method for determining a set value of a pressure for inspection in a wafer inspection apparatus, a surrounding space sealable between a chuck top and a probe card by a vacuum mechanism is evacuated and a highest negative pressure in the surrounding space is measured as a reference pressure when the chuck top has floated by the evacuation. Then as a reference height position, a height position of the chuck top corresponding to the reference pressure is obtained. Further, a pressure in the surrounding space is decreased to a level lower than the reference pressure, the pressure in the surrounding space, when the chuck top reaches a target height position obtained by adding a preset overdrive amount for a press-contact state between the probe card and the wafer to the reference height position, is measured and the measured pressure is set as the set value of the pressure.

14 Claims, 22 Drawing Sheets

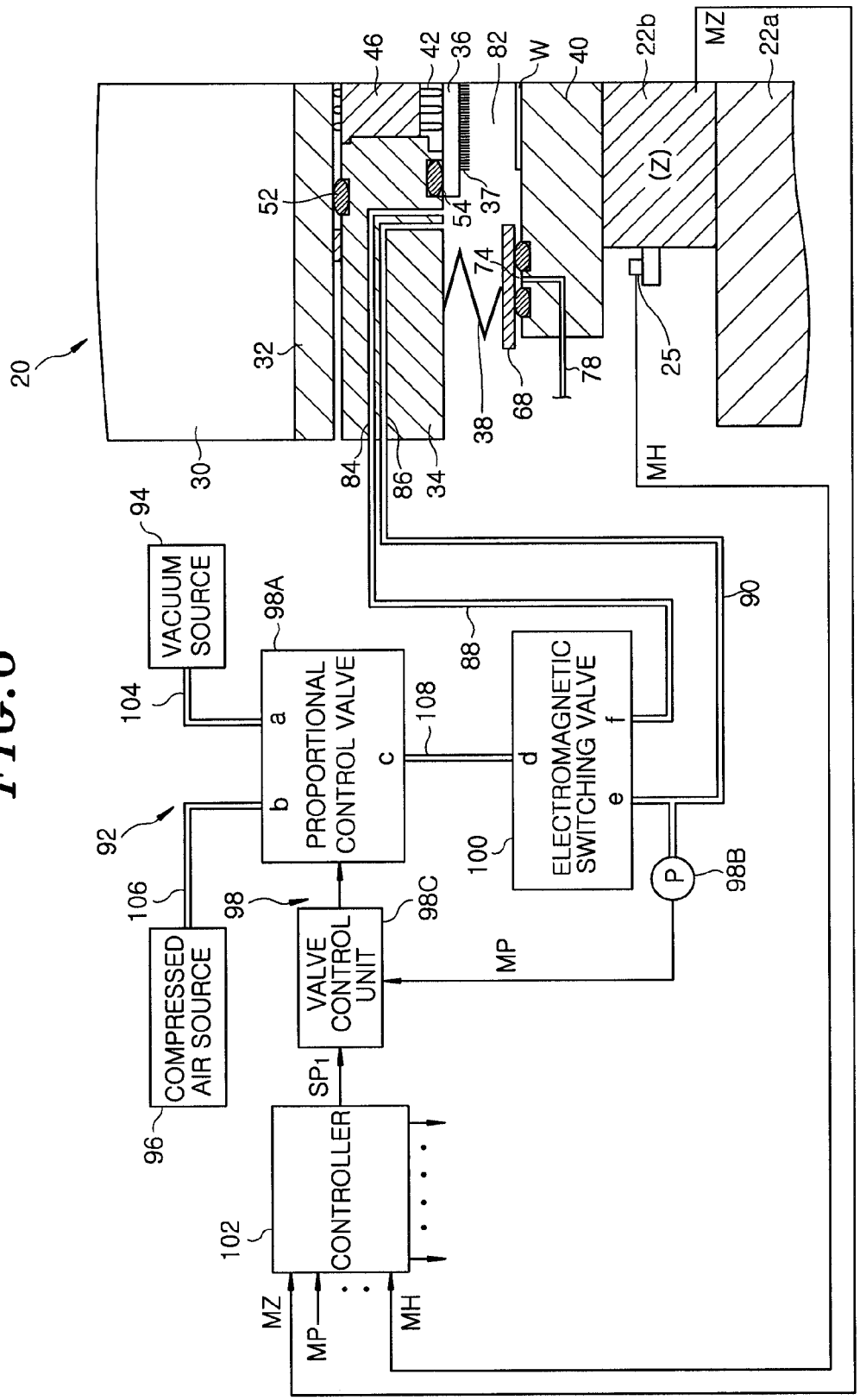

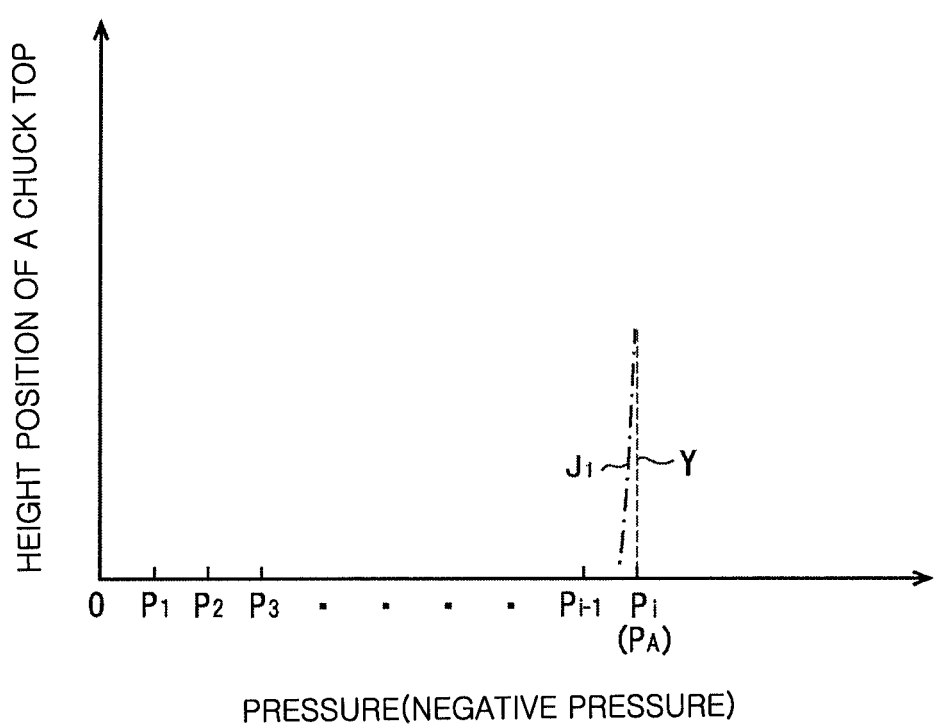

METHOD FOR DETERMINING SET VALUE OF PRESSURE FOR INSPECTION IN WAFER INSPECTION APPARATUS

CROSS-REFERENCE TO RELATED APPLICATIONS

This application claims priority to Japanese Patent Application No. 2014-182897 filed on Sep. 9, 2014, the entire contents of which. are incorporated herein by reference.

FIELD OF THE INVENTION

The disclosure relates to a method for determining a set value of a pressure for inspection in a wafer inspection apparatus. The pressure for inspection is a negative pressure for obtaining a desired pressing force by using a pressure control mechanism in wafer inspection performed by making press-contact between a probe card and a wafer.

BACKGROUND OF THE INVENTION

Generally, in manufacturing semiconductor devices, after all wafer level processes are completed, the semiconductor devices, e.g., integrated circuits, formed on a wafer are inspected to determine whether not the semiconductor devices have required electrical characteristics. In this wafer inspection process, a probe card having a plurality of needle-shaped contactors is used as an inspection jig.

In order to perform the wafer inspection, the probe card and the wafer are aligned such that the contactors are respectively made to face corresponding electrodes on a surface of the wafer and, then, a proper press-contact is made therebetween. After leading ends of the contactors are brought into contact with the wafer surface, the contactors are relatively pressed by a predetermined stroke, i.e., by an overdrive amount. Accordingly, the leading ends of the contactors are respectively brought into press-contact with the corresponding electrodes while breaking a protective film or a contamination film on the wafer surface.

Recently, there is developed a wafer inspection apparatus that allows a wafer to be inspected by one of a plurality of probe cards provided in an inspection chamber while another wafer is being transferred and pressed to or separated from another probe card by a transfer robot or a moving table commonly used for the probe cards. In this wafer inspection apparatus, the single moving table is commonly used for the multiple probe cards and, thus, a configuration of a prober, especially a configuration near a wafer supporter or a chuck top, becomes simple. Further, the integration of probers and the space efficiency are considerably improved (refer to, e.g., Japanese Patent Application Publication No. 2002-22768).

In the above wafer inspection apparatus having a single moving table commonly used for a plurality of probe cards, there is formed a surrounding space sealed between each of the probe cards and the chuck top so apply a vacuum attractive force to the chuck top and/or the probe card. Accordingly the wafer on the chuck top can be brought into press-contact with each of the probe cards by the vacuum. attractive force.

In order to form such a surrounding space, a vertically extensible/contractible cylindrical member, e.g., a bellows is provided around each of the probe cards. Upon completion of the position alignment between the probe card and the wafer, the surrounding space is sucked to vacuum by or in response to the lifting of the chuck top by the moving table. Accordingly, an upward force is applied to the chuck top due to a pressure difference between a pressure (negative pressure) in the surrounding space and an ambient pressure (e.g., atmospheric pressure). Due to the upward force caused from the vacuum attractive force, each contactor of the probe card can be stably in press-contact with each corresponding electrode on the wafer surface by a preset pressure.

In that case, the negative pressure applied between the probe card and the wafer by the vacuum attractive force needs to be precisely coincided with the pressure applied between the probe card and the wafer by a force of lifting the chuck top by the moving table. If not, when the vacuum attractive force replaces the force of lifting the chuck top by the moving table to maintain a press-contact state between the probe card and the wafer, a desired overdrive amount of the press-contact may be not kept properly. Accordingly, the wafer inspection is abnormally performed, or a jig or a workpiece is damaged. In other words, when the vacuum attractive force is weaker than the force of lifting the chuck top, the overdrive amount is decreased and this may result in abnormal wafer inspection. On the other hand, when the vacuum attractive force is stronger than the force of lifting the chuck top, the overdrive amount is increased and this may result in damages of the contactors or the electrodes.

Generally, a deformation amount of a contactor with respect to a load is one of the specifications of the probe card. Therefore, a set value of a load (probe load) to be applied to the probe card with respect to a predetermined overdrive amount, i.e., the amount of deformation of the contactor, may be obtained from the specifications. Thus, in the wafer inspection apparatus, a set value of a negative pressure to be applied to the surrounding space can be theoretically calculated from the set value of the probe load and a shape or an area of the surrounding space.

However, the probe card actually has a design or a manufacturing error and an individual difference (variation). Further, the specifications of the probe card are not satisfied in many cases. Accordingly, a set value (theoretically calculated value) of a negative pressure to be applied between the probe card and the wafer by the vacuum attractive force cannot guarantee a predetermined overdrive amount.

SUMMARY OF THE INVENTION

In view of the above, the disclosure provides a method for determining a set value of a pressure for inspection, which is capable of determining a set value of an optimal negative pressure for obtaining a desired overdrive amount by using a vacuum attractive force in wafer inspection performed by making press-contact between a probe card and a wafer.

In accordance with an aspect, there is provided a method for determining a set value of a pressure for inspection in a wafer inspection apparatus. The inspection apparatus includes: a probe card having a plurality of contactors to be respectively brought into contact with a plurality of electrodes formed on a surface of a wafer as an inspection target; a movable chuck top configured to mount the wafer thereon to face the probe card; and a vacuum mechanism configured to control a pressure in a surrounding space sealable between the chuck top and the probe card to a predetermined set value of a negative pressure for inspection in order to generate or maintain a press-contact state between the probe card and the wafer by a predetermined pressing force. The method includes the steps of: (a) evacuating the surrounding space by the vacuum mechanism and measuring, as a reference pressure, a highest negative pressure in the surrounding space which is obtained when the chuck top floats;

(b) obtaining, as a reference height position, a height position of the chuck top which corresponds no the reference pressure; and (c) decreasing a pressure in the surrounding space to a level lower than the reference pressure, measuring the pressure in the surrounding space when the chuck to reaches a target height position obtained by adding a preset overdrive amount for the press-contact state between the probe card and the wafer to the reference height position, and setting the measured pressure as the set value of the pressure for inspection.

BRIEF DESCRIPTION OF THE DRAWINGS

The objects and features of the disclosure will become apparent from the following description of embodiments, given in conjunction with the accompanying drawings, in which:

FIG. 6 is a block diagram showing a configuration of a vacuum mechanism for obtaining and/or holding an overdrive;

FIG. 9 is an example of a graph showing correlation (characteristics) between a pressure in a surrounding space and a height position of the chuck top in the reference pressure measurement process;

DETAILED DESCRIPTION OF THE EMBODIMENTS

Hereinafter, embodiments will be described. First, a configuration and an operation of a wafer inspection apparatus to which a method for determining a set value of a pressure for inspection of the disclosure can be applied will be described with reference to FIGS. 1 to 5.

[Layout of the entire system]

Figure 1:
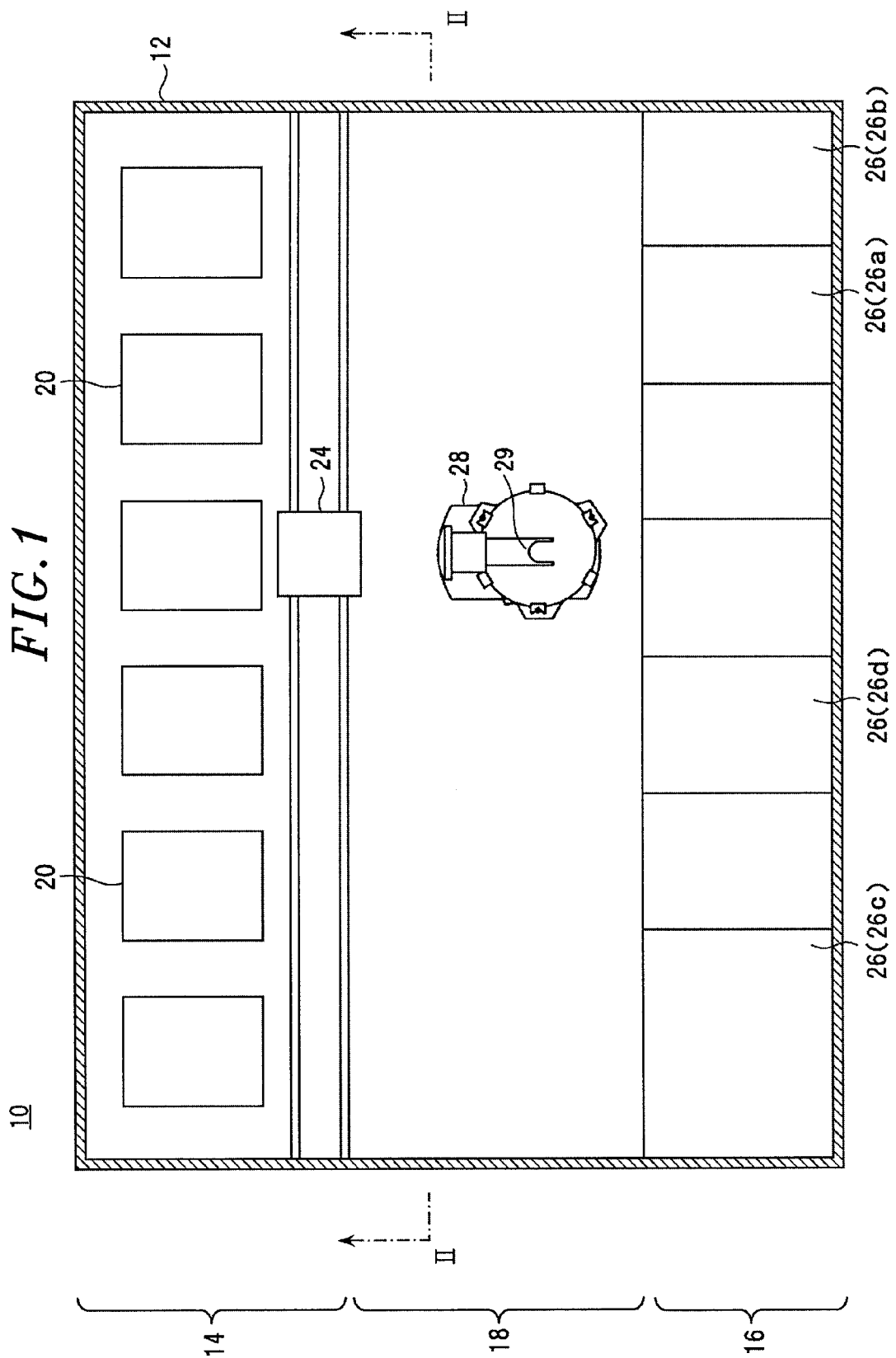
FIG. 1 is a top view schematically showing an overall configuration of a wafer inspection apparatus according to an embodiment.
Figure 2:
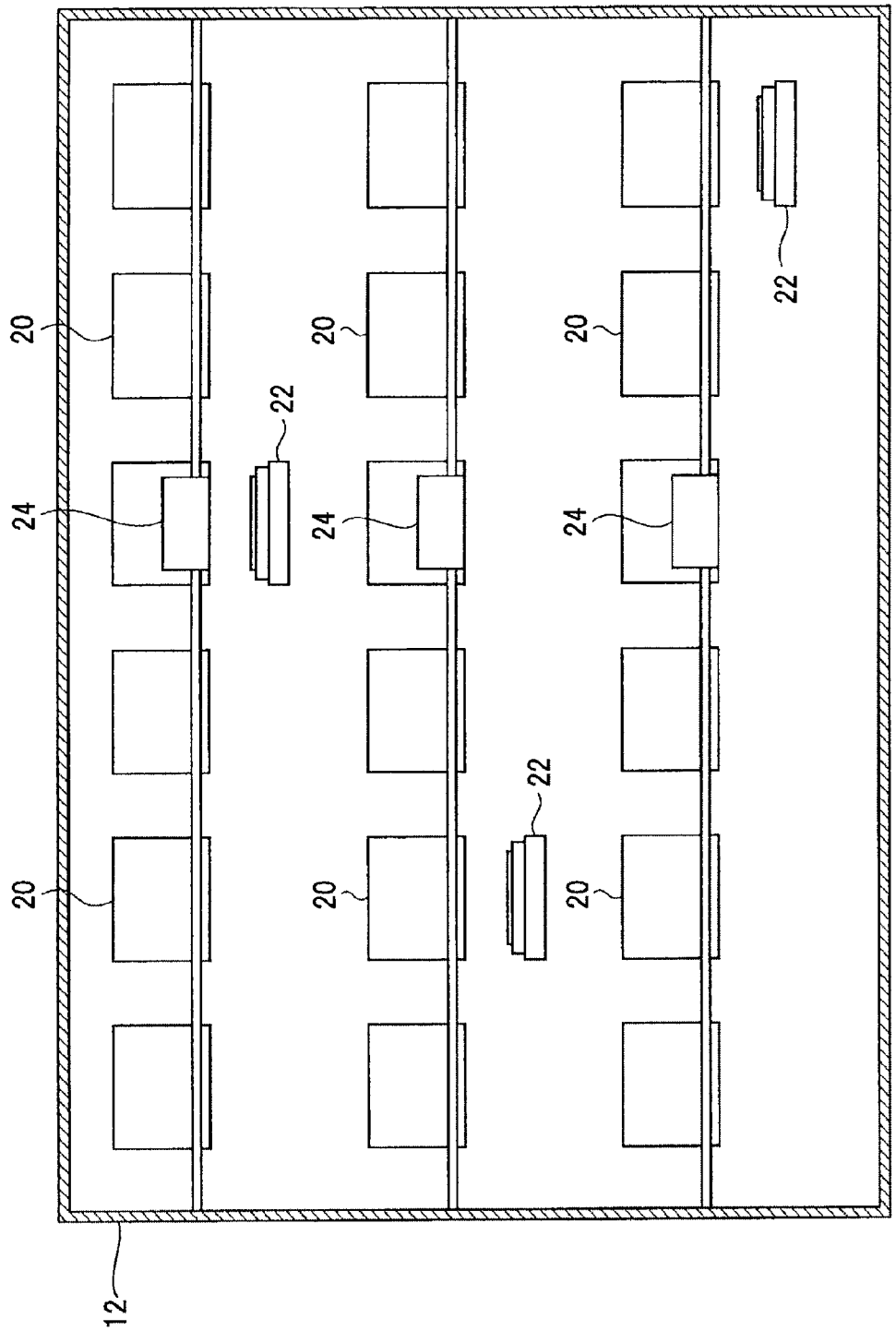
FIG. 2 is a side view schematically showing the overall configuration of the wafer inspection apparatus.

FIGS. 1 and 2 schematically show an overall configuration of a wafer inspection apparatus according to an embodiment. As illustrated, a wafer inspection apparatus 10 includes a wafer inspection chamber 12 three-dimensionally accommodating a plurality of probers to each of which a probe card is attached. As can be seen from the top view of FIG. 1, an inner space of the wafer inspection chamber 12 is partitioned into an inspection area 14, a loading/unloading area 16, and a transfer area 18. In the inspection area 14, there is performed wafer level inspection of electrical characteristics of a plurality of semiconductor devices formed on a wafer as an inspection target. In the loading/unloading area 16, there is performed loading/unloading of the wafer and the probe card and man-machine interface of a control system. The transfer area 18 is disposed between the inspection area 14 and the loading/unloading area 16.

As can be seen in FIG. 2, in the inspection area 14, tester built-in probers 20 that are test devices or interfaces for wafer inspection are provided in multiple stages, e.g., three stages. In each stage, a plurality of probers 20 is arranged in a single horizontal row. Further, in each stage, a single moving table 22 capable of moving along the arrangement direction (horizontal direction) of the plurality of (e.g., six) probers 20 arranged in a single horizontal row is provided below the probers 20 and a single camera 24 capable of moving along the arrangement direction is provided at a front or a side portion close to the transfer area 18. The moving table 22 can access a position immediately below the probers 20 by horizontal movement. The moving table 22 includes a multi-axis moving mechanism that moves a chuck top for mounting thereon the wafer in a vertical direction on a horizontal plane so that the wafer as an inspection target can be position-aligned, pressed against or separated from a probe card attached to each of the probers 20. The camera 24 is used for, e.g., position alignment of the wafer in each prober 20.

The loading/unloading area 16 is partitioned into a plurality of accommodating spaces 26. Installed in the accommodating spaces 26 are a carrier port 26a for receiving a container, e.g., a FOUP, accommodating a predetermined number of wafers; an aligner 26b for performing position alignment of the wafer; a probe card loader 26c for loading/unloading a probe card that has been used or will be used in the wafer inspection apparatus 10; and a system controller 26d for performing overall control of the components in the wafer inspection apparatus 10.

In the transfer area 18, there is provided a three-dimensionally movable transfer robot 28 that can move in the transfer area 18 and access the inspection area 14 and the loading/unloading area 16. The transfer robot 28 transfers an inspected wafer or a wafer to be inspected between the carrier port 26a and any prober 20 in the inspection area 14. Further, the transfer robot 28 transfers an old probe card and a new probe card, which are to be exchanged, between the probe card loader 26c and any prober 20 in the inspection area 14. The transfer robot 28 has a pair of transfer arms 29, and is configured to take a wafer from a target place with one of the transfer arms 29 and transfer another wafer held by the other transfer arms to the target place in pick and place manner.

In this wafer inspection apparatus 10, the probers 20 to each of which the probe card is attached are three-dimensionally arranged at multiple stages in the wafer inspection chamber 12. The single moving table 22 is commonly used for the plurality of probers 20 arranged in one horizontal row in each stage. While the wafer is pressed against or separated from a probe card of one of the probers 20 by the moving table 22, another wafer is inspected by another prober 20. Thus, the configuration of the prober 20, especially around the chuck top, becomes simple. Further, the space efficiency of the wafer inspection chamber 12 (especially, a footprint) is considerably improved by the three-dimensionally integrated arrangement of the probers 20.

[Configuration Around the Prober]

Figure 3:
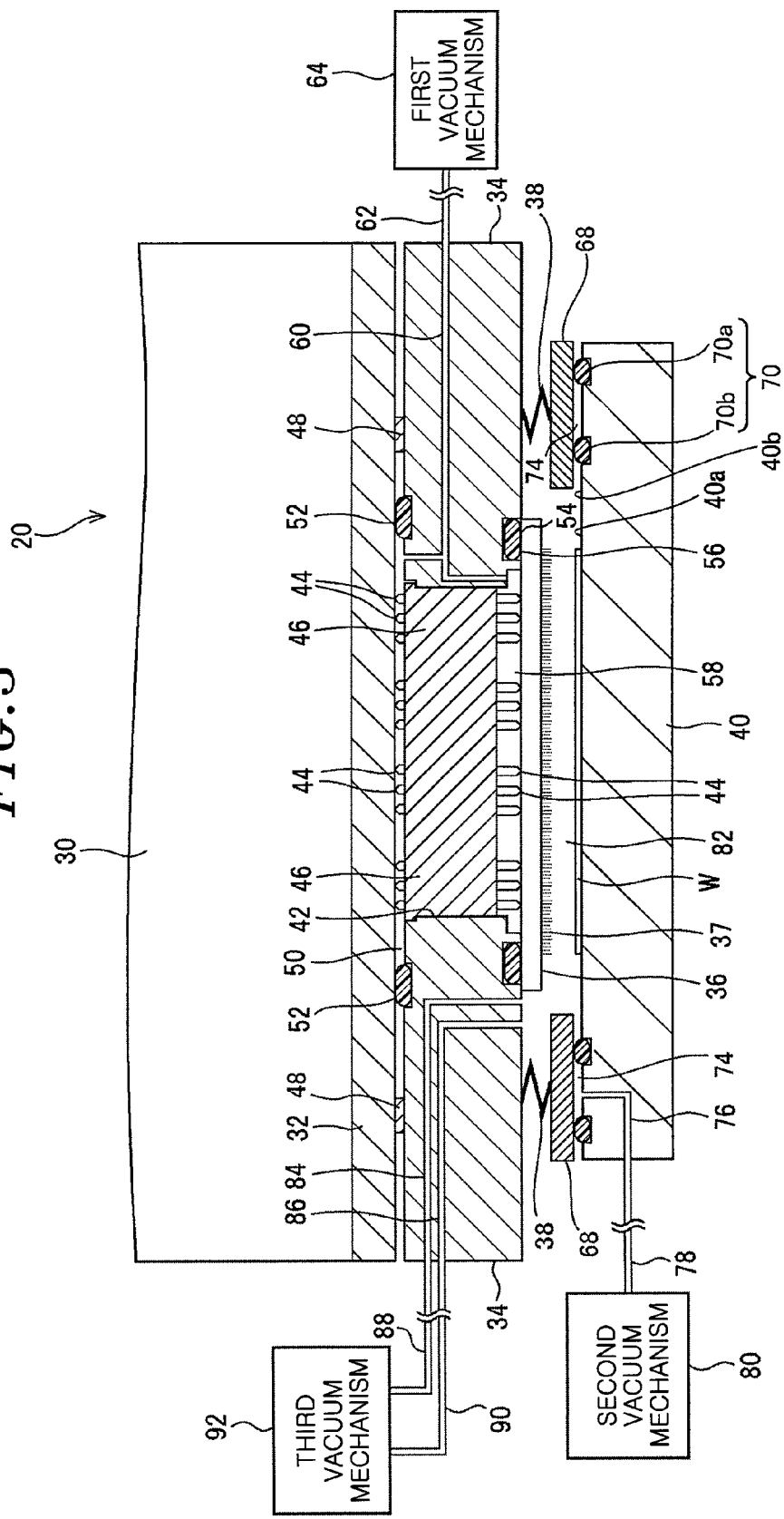
FIG. 3 is a cross sectional view showing principal parts of a prober according to an embodiment.

FIG. 3 shows a main configuration of the prober 20 according to the embodiment. The prober 20 has therein a tester 30 as one unit. The prober 20 includes: a probe card 36 detachably attached to a mother board 32 of the tester 30 through a thick plate-shaped pogo frame 34; an extensible/contractible cylindrical member, e.g., a bellows 38, provided around the probe card 36; and a thick plate-shaped chuck top 40 on which a wafer W as an inspection target is mounted to face the probe card 36.

Formed at the central portion of the pogo frame 34 is a through hole or a pogo block mounting hole 42 having a diameter smaller than a diameter of the probe card 36. An approximately cylindrical or disc-shaped pogo block 46 which holds a plurality of pogo pins 44 vertically penetrating therethrough is detachably inserted into the pogo block mounting hole 42. Leading ends (lower ends) of the pogo pins 44 are respectively brought into elastic press-contact with corresponding electrodes on a top surface of the probe card 36 by a vacuum attractive force applied to the pogo frame 34 and the probe card 36 by a first vacuum mechanism 64 to be described later. Top ends (upper ends) of the pogo pins 44 are pressed against electrodes of the mother board 32 which correspond thereto.

A plurality of needle-shaped contactors or contact probes 37 is attached the probe card 36 in a predetermined pattern. Leading ends of the contact probes 37 protrude from a bottom surface of the probe card 36 to face corresponding electrodes corresponding thereto on the surface of the wafer W mounted on the chuck top 40.

A gap 50 is formed between the pogo frame 34 and the mother board 32 with an annular spacer 48 interposed therebetween. The gap 50 is divided in a radial direction by the annular seal member 52 provided around a pogo block attachment area. A gap 56 is formed between the pogo frame 34 and the probe card 36 and divided in a radial direction by an annular seal member 54 provided around the pogo block attachment area. Accordingly, a suction space 58 surrounded by the mother board 32, the probe card 36 and the seal members 52 and 54 is formed.

The suction space 58 is connected to the first vacuum mechanism 64 for holding a probe card 36 through a gas channel 60 and an external line 62 formed at a peripheral portion of the pogo frame 34. The first vacuum mechanism 64 has a vacuum source such as a vacuum pump, a factory vacuum source, the like. The first vacuum mechanism 64 depressurizes the suction space 58 to a predetermined negative pressure and maintains the depressurized state. Accordingly, the probe card 36 and the pogo frame 34 are attached to the mother board 32 by an upward force generated by a pressure difference between the pressure (negative pressure) in the suction space 58 and an ambient pressure.

The bellows 38 is made of a metal and is extensible and contractible in a vertical direction, i.e., in a direction perpendicular to a flat surface of the probe card 36. An upper end of the bellows 38 is coupled to a bottom surface of the pogo frame 34. A lower end of the bellows 38 is detachably coupled to a top surface of a peripheral portion of the chuck top 40 via an annular lower flange 68 by a vacuum attractive force.

More specifically, the top surface of the chuck top 40 is divided into a wafer mounting surface 40a, i.e., a central portion for mounting thereon the wafer W, and a bellows connecting surface 40b, i.e., a peripheral portion extending in an annular shape at an outer side in a radial direction of the wafer mounting surface 40a. Provided at the bellows connecting surface 40b is a seal member 70 formed of two O-rings 70a and 70b having different diameters and disposed in a concentric circular shape. Upper portions of the O-rings 70a and 70b protrude beyond the bellows connecting surface 40b. In a state where top surfaces of the O-rings 70a and 70b are in contact with a bottom surface of the lower flange 68, an annular space 74 between the O-rings 70a and 70b serves as a sealable suction space.

The suction space 74 is connected to a second vacuum mechanism 80 for a bellows through a gas channel 76 formed in the chuck top 40 and an external line 78. The second vacuum mechanism 80 has a vacuum source such as a vacuum pump, a factory vacuum source or the like. Since the volume of the suction space 74 is small, the sealed suction space 74 can be instantly depressurized from the atmospheric pressure to the predetermined negative pressure. Due to the vacuum evacuation, a downward force generated by a pressure difference between the pressure (negative pressure) in the suction space 74 and the ambient pressure, i.e., the atmospheric pressure is applied to the lower flange 68. Accordingly, the lower end of the bellows 38 is coupled to the bellows connecting surface 40b of the chuck top 40 via the lower flange 68 and the seal member 70.

In a state where the lower end of the bellows 38 is coupled to the bellows connecting surface 40b of the chuck top 40, a suction space or a surrounding space 82 which can be sealed is formed between the probe card 36, the bellows 38, and the chuck top 40. The surrounding space 82 is connected to a third vacuum mechanism 92 for holding an overdrive through gas channels 84 and 86 formed in the pogo frame 34 and external lines 88 and 90.

Since the third vacuum mechanism 92 has a vacuum source such as a vacuum pump, a factory vacuum source, or the like, even when the volume of the surrounding space 82 is considerably large, the surrounding space 82 can be depressurized quickly and in a short period of time from a reference pressure close to an atmospheric pressure to a negative set pressure at which a desired vacuum attractive force is obtained. Due to the vacuum evacuation, an upward force generated by a pressure difference between the pressure (negative pressure) in the surrounding space 82 and the ambient pressure, i.e., the atmospheric pressure is applied to the chuck top 40. Accordingly, the wafer W on the chuck top 40 is pressed to the probe card 36 against an elastic reaction force of the contact probe 37 and the gravity acted on the chuck top 40.

[Operation of the Movable Unit in the Wafer Inspection]

Figure 4:
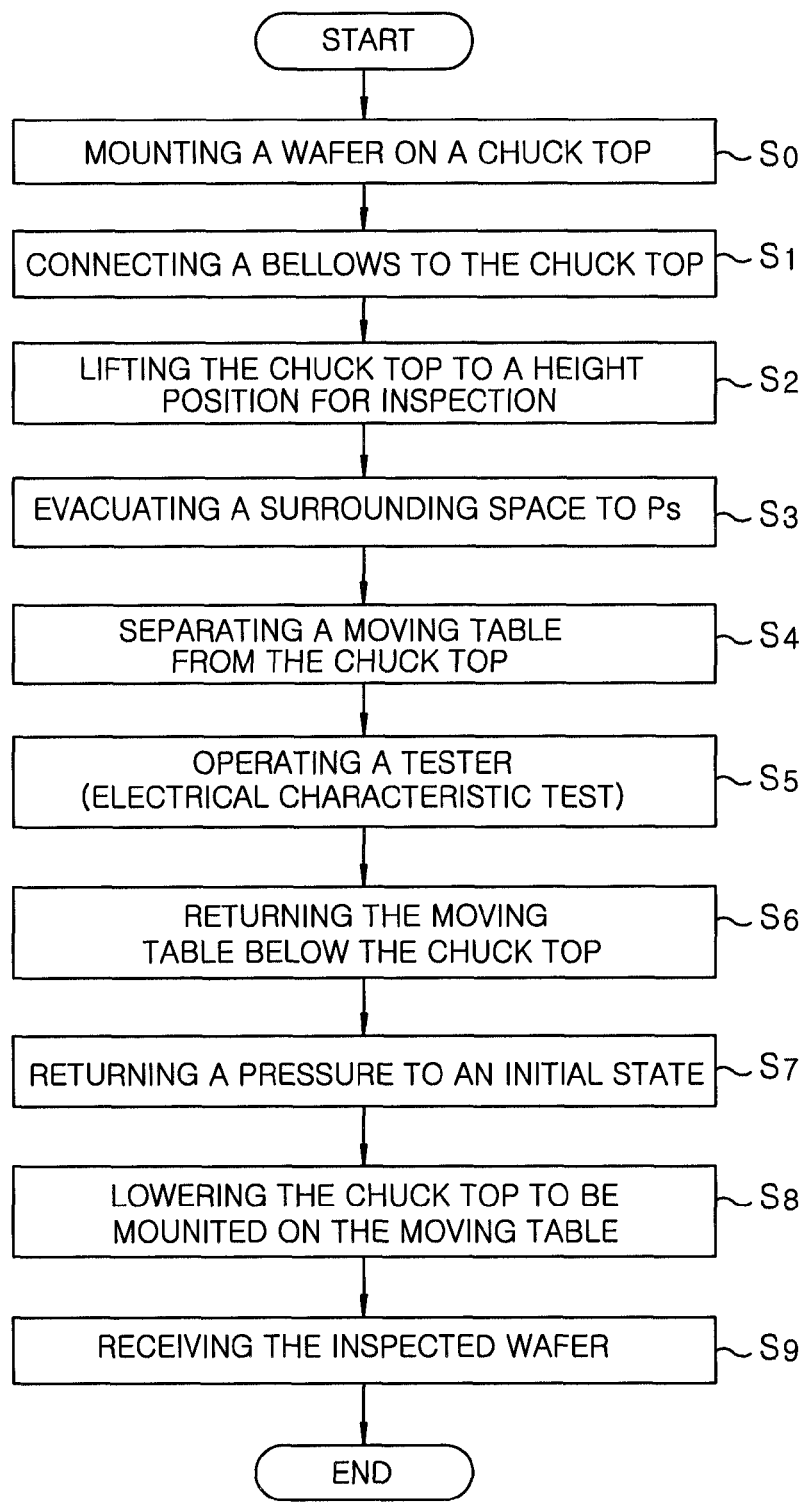
FIG. 4 is a flowchart showing a main control sequence of a controller in one cycle of a wafer inspection.

FIG. 4 shows a main control sequence of a controller 102 (see FIG. 6) in the case of performing a single wafer inspection process in a prober 20 of the present embodiment.Each component in the prober 20 operates under the control of the controller 102. Hereinafter, a main operation of a movable unit in a single wafer inspection process will be described with reference to FIGS. 4 and 5A to 5D. A set value $P_S$ of a pressure for inspection which is used by the third vacuum mechanism 92 is predetermined.

Figure 5A:
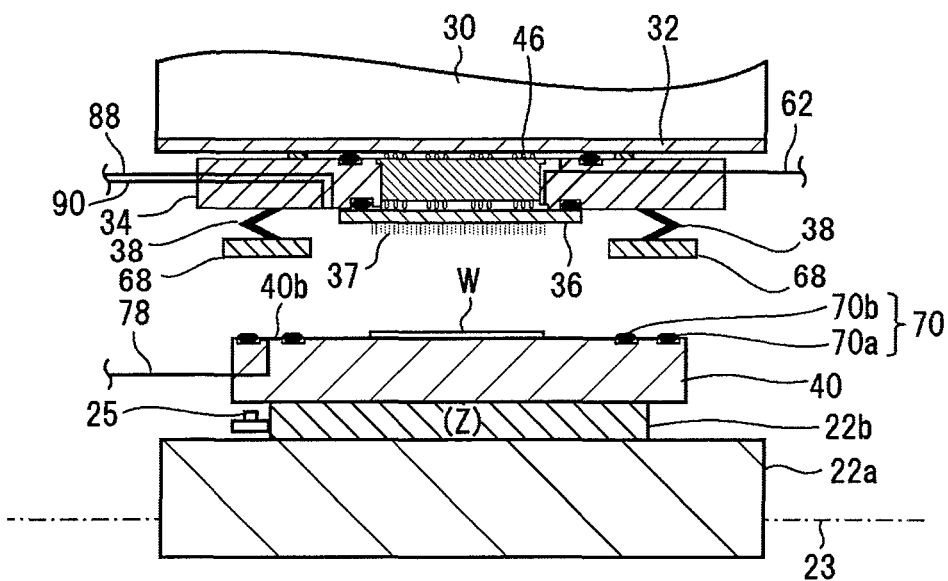
FIGS. 5A to 5D show an operation of a wafer inspection apparatus in one cycle of a wafer inspection.

Before the wafer W is inspected, the chuck top 40 is separated from the bellows 38 and supported below the probe card 36 with a large space therebetween by the moving table 22 as shown in FIG. 5A. In that state, the wafer W to be inspected is mounted on the chuck top 40 by the transfer robot 28 (see FIG. 1) (step $S_0$). The wafer W mounted on the chuck top 40 is fixed or held by a vacuum type or a mechanical chuck mechanism (not shown) provided at the chuck top 40. At this time, the first vacuum mechanism 64 maintains an ON state and the second and the third vacuum mechanism 80 and 92 maintains an OFF state.

The moving table 22 is movable in XYZθ directions. For example, the moving table 22 includes a horizontal moving unit 22a, a Z-axis moving (elevation) unit 22b, and a θ-axis moving unit (not shown). The horizontal moving unit 22a includes an X-axis moving part (not shown) and a Y-axis moving part (not shown). After the wafer W is mounted on the chuck top 40, position alignment in the horizontal plane between the probe card 36 and the wafer W is performed by the camera 24 (see FIG. 2) and the horizontal moving unit 22a of the moving table 22. For example, the moving table 22 is obtained by providing the Z-axis moving (elevation) unit 22b and the θ-axis moving unit (not shown) at multiple stages on the horizontal moving unit 22a. Horizontal lines indicated by dashed dotted lines 23 in FIGS. 5A to 5D schematically show a guide rail of the X-direction moving part formed of, e.g., a linear motor, for moving the moving table 22 in the X direction. The horizontal moving unit 22a of the moving table 22 is configured to move or stop at a constant height position.

Figure 5B:
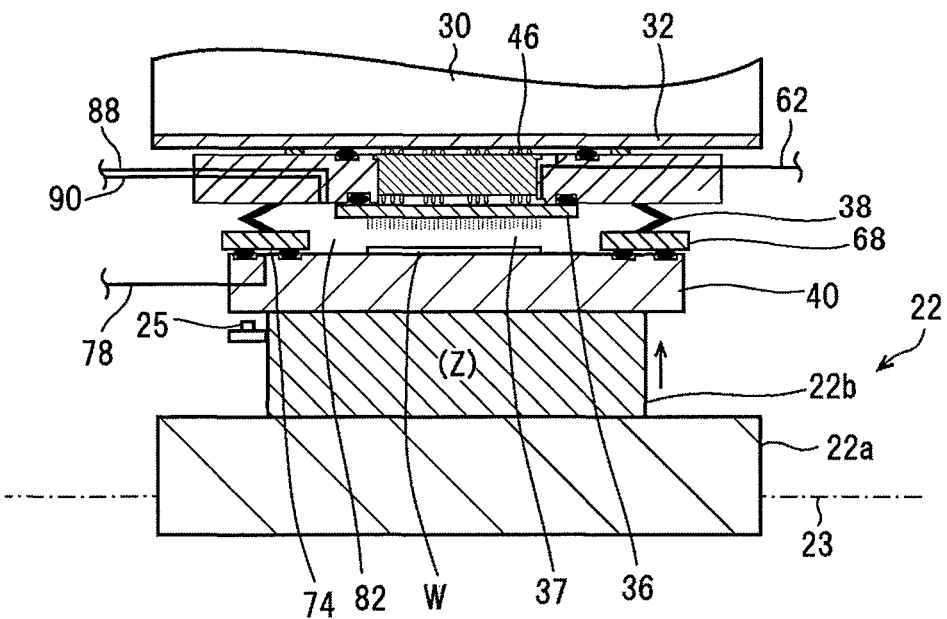

Upon completion of the position alignment, the moving table 22 operates the elevation moving unit (Z-axis moving unit 22b) to lift the chuck top 40 in the vertical direction. The second vacuum mechanism 80 for connecting a bellows is switched ON and the bellows 38 is connected to the chuck top 40 when or immediately after the seal members 70 (O-rings 70a and 70b) protruding from the bellows connecting surface 40b of the chuck top 40 are brought into contact with the bottom surface of the lower flange 68 (step $S_1$), as shown in FIG. 5B. When the bellows 38 is connected to the chuck top 40, the sealable surrounding space 82 is formed between the probe card 36, the bellows 38, and the chuck top 40. In that state, the third vacuum mechanism 92 still maintains the OFF state.

A distance sensor or height sensor 25 is provided at an upper portion of the Z-axis moving unit 22b of the table 22 to face the bottom surface of the chuck top 40. The height sensor 25 optically measures a distance to the object (the chuck top 40) disposed directly thereabove and outputs a measured distance as an electrical signal. The controller 102 constantly obtains the height position of the height sensor 25 from a position detection signal MZ received from position sensor (e.g., an encoder) in the Z-axis moving (elevation) unit 22b or from a control signal applied to the Z-axis moving (elevation) unit 22b. Therefore, the controller 102 can constantly measure or monitor the height position of the chuck top 40 from the output signal (measured distance) of the height sensor 25.

Figure 5C:
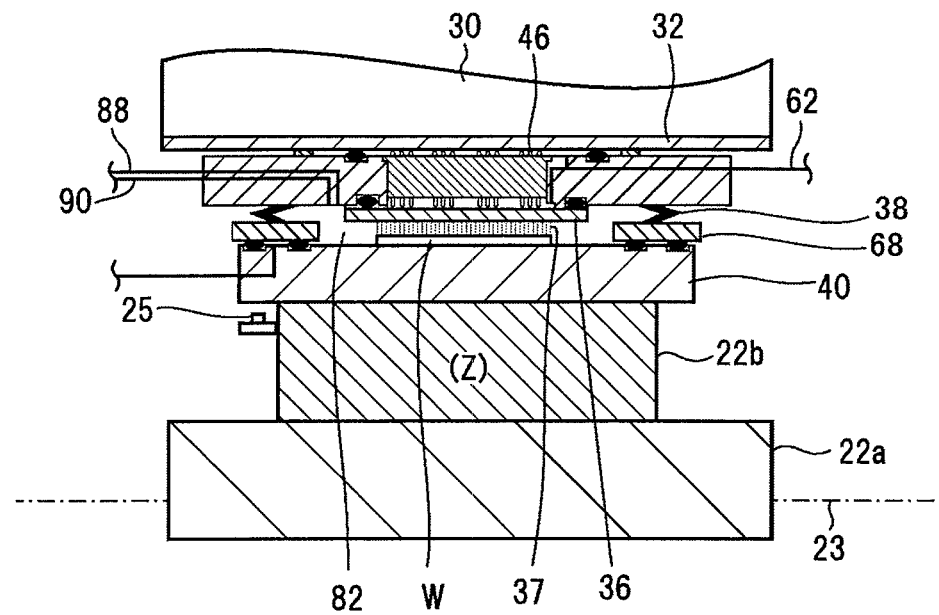

Even after the bellows 38 is connected to the chuck top 40, the moving table 22 continues the lifting of the chuck top 40 by operating the Z-axis moving (elevation) unit 22b. After the surface of the wafer W is brought into contact with the leading ends of the contact probes 37, the chuck top 40 is lifted against the elastic reaction force of the contact probes 37 (overdrive operation.). When the height position H of the chuck top 40 reaches a predetermined height position $H_S$, i.e., when a displacement the same as a predetermined overdrive amount OD for the contact probes 37 is obtained, the lifting operation is stopped (step $S_2$). With the overdrive operation, the leading ends of the contact probes 37 are properly pressed and brought into contact with the electrodes corresponding thereto while breaking the protective film or the contamination film on the surface of the wafer W. In this manner, a press-contact state, the state in which the probe card 36 and the wafer W are pressed and brought into contact with each other by the predetermined overdrive amount OD, is obtained as shown in FIG. 5C.

Figure 5D:
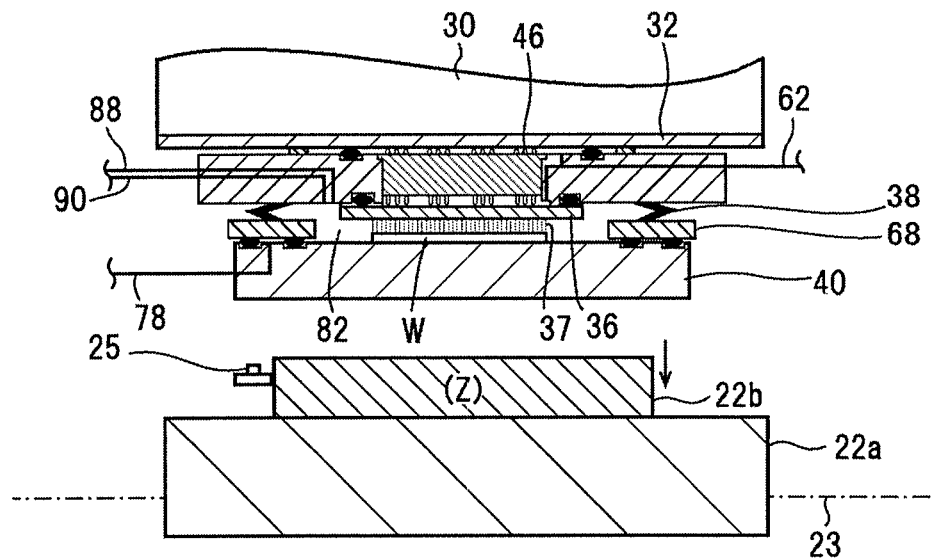

In the present embodiment, the third vacuum mechanism 92 for holding an overdrive is switched ON in the press-contact state where the probe card 36 and the wafer W are brought into press-contact with each other at a predetermined pressure upon completion of the lifting operation of the chuck top 40 by the moving table 22 and the overdrive operation. The third vacuum mechanism 92 evacuates the surrounding space 82 from the pressure close to the atmospheric pressure to the set value $P_s$ of a pressure for inspection which is preset (step $S_3$). As a consequence, a vertically upward force due to the pressure difference between the vacuum pressure in the surrounding space 82 and the ambient atmospheric pressure is applied to the chuck top 40. Accordingly, the state in which the probe card 36 and the wafer W are brought into press-contact with each other by the predetermined overdrive amount Od is maintained. Thereafter, the Z-axis moving (elevation) unit 22b is moved downward and the moving table 22 is separated from the chuck top 40, as shown in FIG. 5D (step $S_4$). Next, the moving table 22 is moved to another prober 20 in the same stage.

In the corresponding prober 20, the tester 30 operates under the condition that the state where the press-contact state between the wafer W and the probe card 36 is maintained by the vacuum attractive force or the vacuum pressure applied from the third vacuum mechanism 92 to the surrounding space 82 as described above. For example, the tester 30 performs wafer level inspection of electrical characteristics of the wafer W via the mother board 32 and the probe card 36 (contact probes 37).

In the prober 20 of the present embodiment, the vacuum attractive force applied between the probe card 36 and the wafer W in the surrounding space 82 by the third vacuum mechanism 92 is made to be substantially the same as the pressing force applied between the probe card 36 and the wafer W by the lifting of the chuck top 40 by the moving table 22. Accordingly, even if the vacuum attractive force replaces the force of lifting the chuck top 40 by the moving table 22 to maintain the press-contact state between the probe card 36 and the wafer W, the overdrive amount is maintained at the predetermined overdrive amount without variation. Therefore, the wafer W is normally inspected. Further, the contact probes 37 of the probe card 36 or the electrodes on the surface of the wafer W are not damaged by an excessive pressing force exceeding the predetermined overdrive amount.

Upon completion of the wafer level inspection of electrical characteristics by the tester 30, the moving table 22 returns to the position below the chuck top 40 (step $S_6$). At this timing, the third vacuum mechanism 92 stops the vacuum evacuation and the operation of returning the surrounding space 82 from the depressurized state to the initial state close to the atmospheric pressure (pressure return operation) is performed for a predetermined period of time (step $S_7$). Due to the pressure return operation, the vacuum attractive force pressing the wafer W on the chuck top 40 against the probe card 36 becomes weak. Thus, the chuck top 40 is lowered and the wafer W is separated from the probe card 36. Lastly, the chuck top 40 is mounted on the moving table 22 (step $S_8$).

Thereafter, the second vacuum mechanism 80 stops the vacuum evacuation and the suction space 74 is returned from the depressurized state to the initial state close to the atmospheric pressure. Since the volume of the suction space 74 is small, the returning is executed instantly and the lower flange 68 can be separated from the bellows connecting surface 40b of the chuck top 40. When the chuck top 40 is further lowered by the moving table 22, the chuck top 40 reaches the height position same as that shown in FIG. 5A and waits for the transfer robot 28 (see FIG. 1). The transfer robot 28 reaches a vicinity of the chuck top 40 and receives the inspected wafer W from the chuck top 40 (step $S_9$). A new wafer W to be inspected by the prober 20 is mounted on the chuck top 40 by the transfer robot 28. Then, the above-described operations (steps $S_1$ to $S_9$) are repeatedly performed on the new wafer W.

[Configuration of the vacuum mechanism for holding an overdrive]

Next, the configuration. of the third vacuum mechanism 92 for holding an overdrive will be described with reference to FIG. 6.

The vacuum mechanism 92 can supply a negative pressure for generating a vacuum attractive force as well as a positive pressure for generating a separation force to the sealable surrounding space 82 surrounded by the probe card 36, the bellows 38 and the chuck top 40. Therefore, the vacuum mechanism 92 includes, as a pressure source, a vacuum source 94 such as a vacuum pump or a factory vacuum source, and a compressed air source 96 such as a compressor, or the like. Further, the vacuum mechanism 92 has, as main components, an electropneumatic regulator 98, an electromagnetic switching valve 100 and a controller 102. The electropneumatic regulator 98 has a proportional control valve 98A, a pressure sensor 98B and a valve control unit 98C. The controller 102 controls the operation or the state of each component in the vacuum mechanism 92.

More specifically, the output port of the vacuum source 94 is connected to a port "a" of the proportional control valve 98A of the electropneumatic regulator 98 through a line 104. The output port of the compressed air source 96 is connected to a port "b" of the proportional control valve 98A through a line 106.

The proportional control valve 98A has a port "c" in addition to the port "a" and the port "b". In the proportional control valve 98A, the port "a" and the port "b" are connected in parallel to the port "c". The electropneumatic regulator 98 is configured to control a pressure of the port "c" to a proper set value within a predetermined range by mixing a negative pressure inputted to the port "a" of the proportional control valve 98A and a positive pressure inputted to the port "b" at a proper ratio. A lower limit of the above range corresponds to an output value (negative pressure) of the vacuum source 94 and an upper limit corresponds to an output value (positive pressure) of the compressed air source 96. The port "c" of the proportional control valve 98A is connected to a port "d" of the electromagnetic switching valve 100 through a line 108.

The electromagnetic switching valve 100 has a port "e" and a port "f" in addition to the port "d". In the electromagnetic switching valve 100, one of the port "e" and the port "f" is selectively connected to the port "d". The port "e" is connected to the surrounding space 82 through the line 90 and the gas channel 86 formed in the pogo frame 34. A pressure sensor 98B of the electropneumatic regulator 98 is installed in the line 90. The port "f" is connected to the surrounding space 82 through the line 88 and the gas channel 84 formed in the pogo frame 34.

The pressure sensor 98B forms a part of the electropneumatic regulator 98 as described above. An output signal of the pressure sensor 98B, i.e., a measured pressure signal MP indicating a pressure in the line 90, is applied to the valve control unit 98C. The valve control unit 98C generates a comparison error by comparing the measured pressure signal MP from the pressure sensor 98B and a set pressure signal SP indicating a set value of the pressure in the surrounding space 82 which is instructed by the controller 102. The valve control unit 98C controls driving of a valve actuator in the proportional control valve 98A such that the comparison error becomes close to 0.

In the present embodiment, the valve control unit 98C can receive the measured pressure signal MP from the pressure sensor 98B and also the controller 102 can receive the same measured pressure signal MP. For example, the controller 102 can constantly acquire a pressure measurement value indicating a current pressure in the surrounding space 82 from the pressure sensor 98B or another pressure sensor (not shown) provided in the line 88 or 90. In the present embodiment, a gas path network of the vacuum mechanism 92 includes the electromagnetic switching valve 100, the lines 88, 90 and 108 and the controller 102. The gas path network is provided with an atmospheric port or a release port (not shown) for opening the surrounding space 82 to the atmosphere.

[Operation of the Embodiment (Process of Determining Set Value of Pressure for Inspection)]

As described above, in the present embodiment, the vacuum attractive force applied between the probe card 36 and the wafer W in the surrounding space 82 by the vacuum attraction of the third vacuum mechanism 92 is made to be substantially the same as the pressing force applied between the probe card 36 and the wafer W by the lifting of the chuck top 40 by the moving table 22. This is because the third vacuum mechanism 92 for maintaining an overdrive of the probe card 36 of the prober 20 decreases the pressure in the surrounding space 82, under the control of the controller 102, to the set value $P_S$ of a pressure for inspection which is determined by the process (method) for determining a set value of a pressure for inspection of the present embodiment which will be described later.

In the present embodiment, the controller 102 controls operations of the respective components in the vacuum mechanism 92 and performs control for executing the process of determining a set value of a pressure for inspection in the prober 20. The controller 102 includes a microprocessor (CPU) and executes a program that can be downloaded from another computer, e.g., a system controller 26d (see FIG. 1), through a network and that can be read out from a storage medium such as a semiconductor memory, an optical disk, a magneto-optical disk, a magnetic tape or the like. In the present embodiment, the controller 102 is configured as a single control unit. However, a plurality of control units may share the function of the controller 102 in parallel or hierarchically.

Hereinafter, the process (method) of determining a set value of a pressure for inspection of the present embodiment will be described in detail. The process of determining a set value of a pressure for inspection includes three processes to be described later, i.e., a reference pressure measurement process, a reference height position determining process, and a process of measuring a set value of a pressure for inspection. Generally, the process of measuring a set value of a pressure for inspection is performed when the probe card 36 is exchanged in the prober 20 (i.e., a new probe card 36 is installed) or when a set value of the overdrive amount is changed.

Figure 7:
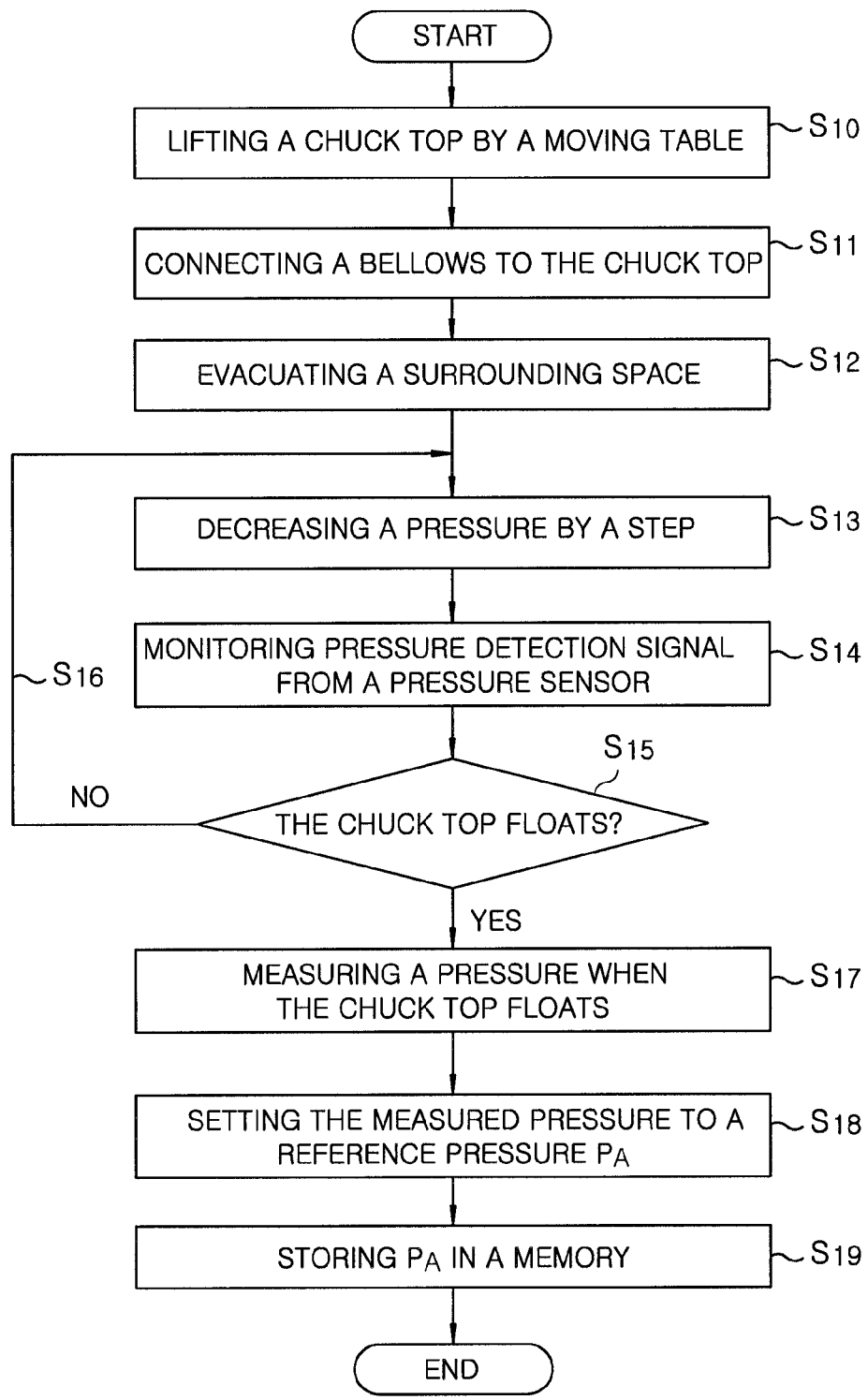
FIG. 7 is a flowchart showing a main sequence (especially, a control sequence of a controller) of a reference pressure measurement process according to an embodiment.

The reference pressure measurement process will be described with reference to FIGS. 7 to 9. FIG. 7 shows a main sequence of the reference pressure measurement process (especially, the control sequence of the controller 102.

Prior to the reference pressure measurement process, the position alignment between the probe card 36 and the chuck top 40 in the horizontal plane is performed by using the camera 24 (see FIG. 2). In other words, the horizontal moving unit 22a of the moving table 22 is moved to a position of XY coordinates where the positions of the probe card 36 and the wafer W are aligned. Upon completion of the position alignment, the controller 102 lifts the chuck top 40 in a vertical direction by the Z-axis moving (elevation) unit 22b of the moving table 22 (step $S_{10}$), and the bellows 38 is connected to the chuck top 40 (step $S_{11}$). The wafer W may be or may not be mounted on the chuck top 40. The weight of the chuck top 40 hardly changes whether the wafer W is mounted or not.

Next, the controller 102 starts evacuation of the surrounding space 82 by driving the third vacuum mechanism 92 without lifting the chuck top 40 by the moving table 22 (step $S_{12}$). Due to the evacuation, a pressure in the surrounding space 82 becomes a vacuum pressure or a negative pressure lower than the atmospheric pressure. The controller 102 decreases the pressure in the surrounding space 82 in a stepwise manner (e.g., by about 0.1 kPa) by the third vacuum mechanism 92 while monitoring the pressure in the surrounding space 82 based on the pressure detection signal $MP_1$ from the pressure sensor 98B (steps $S_{13} \rightarrow S_{14} \rightarrow S_{15} \rightarrow S_{16} \rightarrow S_{13} \ldots$)

Figure 8A:
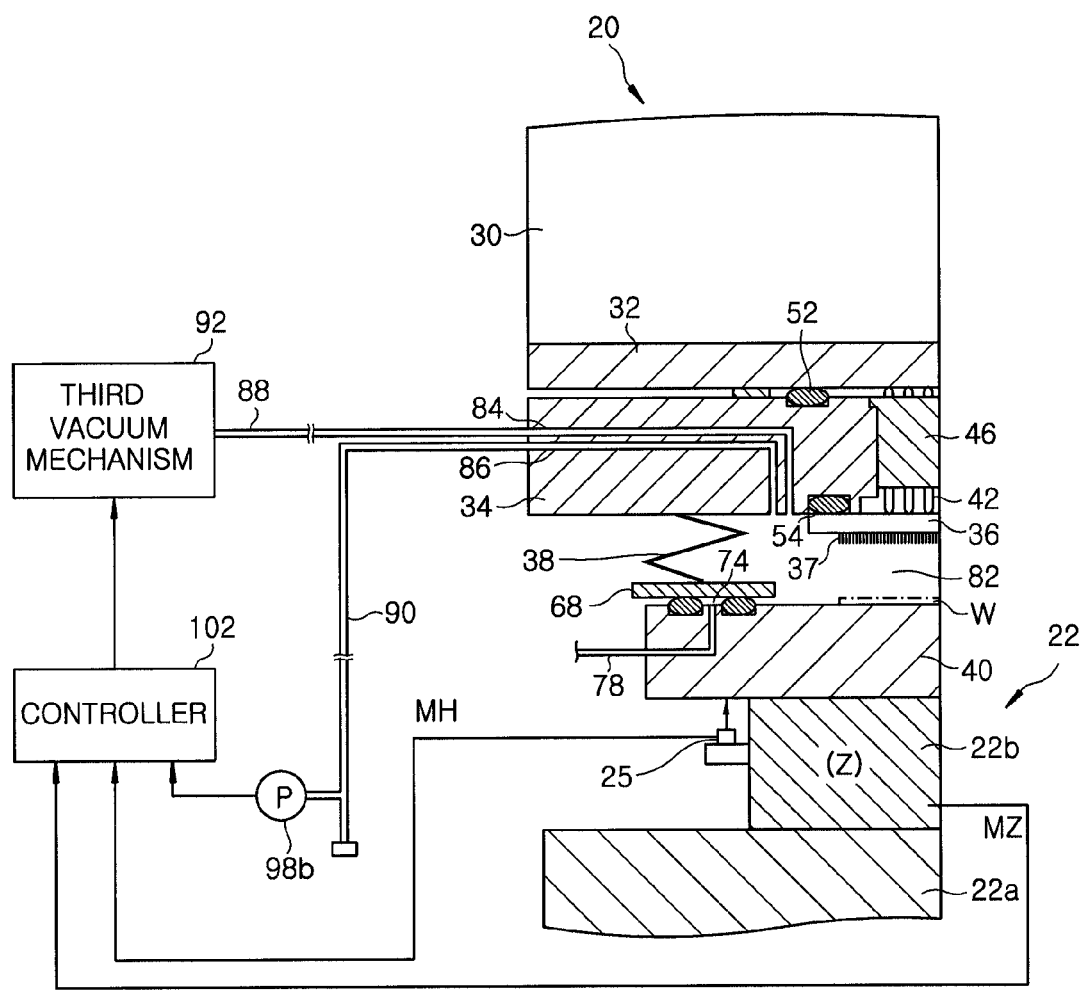
FIG. 8A shows a state of each component in a step of the reference pressure measurement process (before the chuck top floats)

If an absolute value of a vacuum pressure in the surrounding space 82 is gradually increased ($P_1 \rightarrow P_2 \rightarrow P_3 \rightarrow \ldots$), the vertically upward force acting on the chuck top 40 due to the difference between the negative pressure and an outside atmospheric pressure is gradually increased. However, the chuck top 40 keeps stopping at a predetermined height position, i.e., a height position where the chuck top 40 is mounted on the Z-axis moving (elevation) unit 22b as shown in FIG. 8A, until the vacuum attractive force exceeds the vertically downward force acting on the chuck top 40 (mainly the weight of the chuck top 40).

Figure 8B:
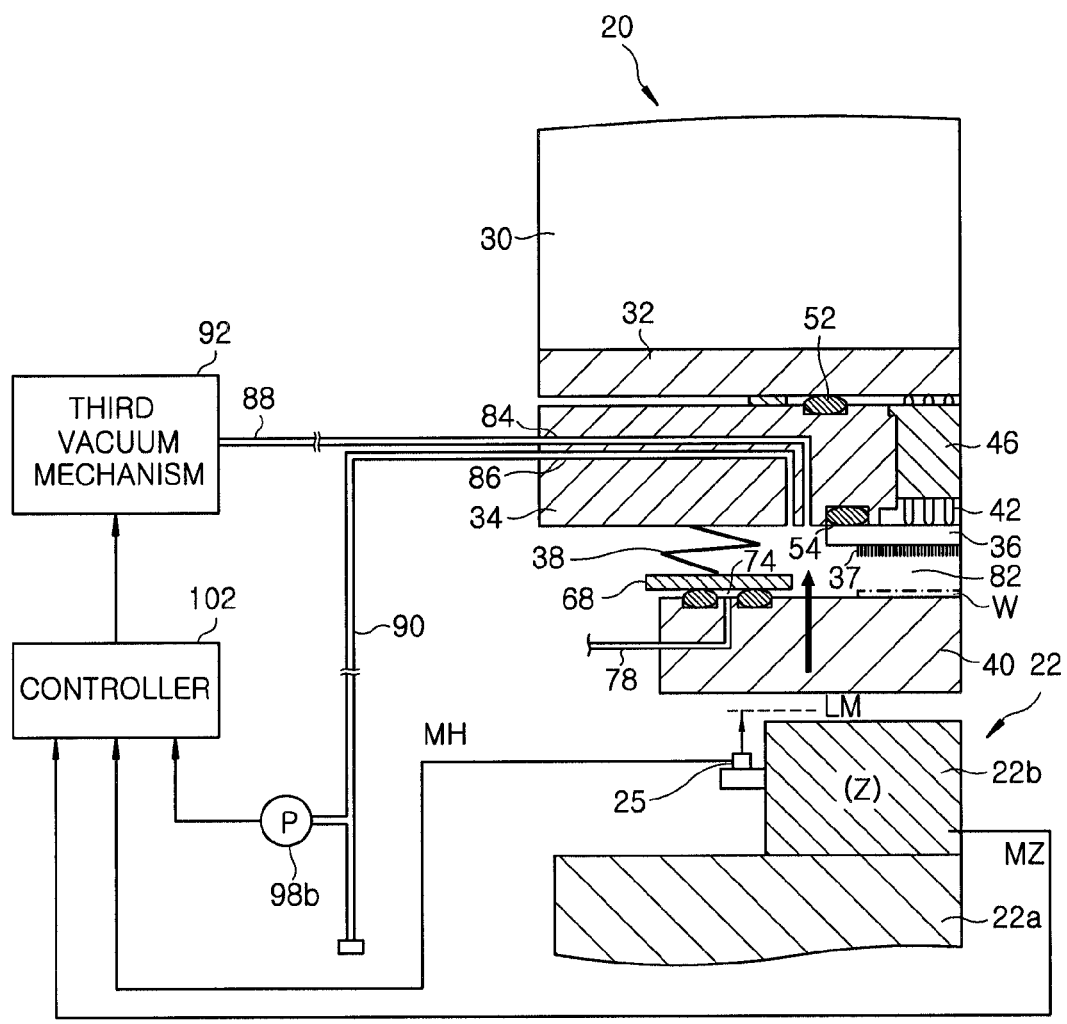
FIG. 8B shows a state of each component in a step of the reference pressure measurement process (when the chuck top floats)

As shown in FIGS. 8B and 9, when the vacuum pressure supplied to the surrounding space 82 is shifted from a certain value $P_{i-1}$ to one-step higher value $P_i$ by the evacuation of the third vacuum mechanism 92, the vertically upward vacuum attractive force acting on the chuck top 40 exceeds the vertically downward force such as gravity or the like and, thus, the chuck top 40 is separated from the Z-axis moving (elevation) unit 22b of the moving table 22 and floats. In that case, the floating amount of the chuck top 40 may be a few mm or above.

The controller 102 checks whether or not the chuck top 40 floats based on an output signal MH (measured distance signal) of the height sensor 25 (step $S_{15}$). The height sensor 25 is a distance sensor that measures a distance in the order of μm. A floating height (a few mm or above) of the chuck top 40 exceeds an upper limit LM (indicated by a dashed line in FIG. 8B) of the distance measurement range of the height sensor 25. The controller 102 monitors the output signal of the height sensor 25 and determines that the chuck top 40 floats when the chuck top 40 is lifted to the height exceeding the distance measurement range of the height sensor 25. The pressure in the surrounding space 82 at this time is measured by the pressure sensor 98B (step $S_{17}$) and the measured pressure $P_i$ is set as the reference pressure $P_A$ (step $S_{18}$). The data of the reference pressure $P_A$ is stored in a memory (step $S_{19}$).

The reference pressure $P_A$ thus measured denotes a pressure in the surrounding space 82 which is obtained when the chuck top 40 floats. In other words, the reference pressure $P_A$ thus measured denotes a highest negative pressure (having a lowest absolute value) to be applied to the surrounding space 82 to obtain a state in which the wafer mounted on the floating chuck top 40 and the probe card 36 are brought into contact with each other by an overdrive amount OD of zero.

When the surrounding space 82 is depressurized to the reference pressure $P_A$, the chuck top 40 floats. However, the height position or posture of the chuck top 40 at the time when the floating chuck top 40 stops is unsettled and cannot be measured.

In FIG. 9, the horizontal axis represents a pressure (negative pressure) in the surrounding space 82 and the vertical axis represents a height position of the chuck top 40 which is measured based on the output signal of the height sensor 25. In FIG. 9, a dashed dotted line $J_1$ virtually shows characteristics between the pressure and the height position of the chuck top which cannot be measured when the chuck top floats.

[Reference Height Position Determining Process]

In the present embodiment, the height position (the reference height position $H_A$) of the chuck top 40 is obtained by the reference height position determining process which will be described below with reference to FIGS. 10 to 12. The reference height position $H_A$ denotes a height position of the chuck top 40 when the prober card 36 and the wafer mounted on the floating chuck top 40 are brought into contact with each other by the overdrive amount OD of zero.

Figure 10:
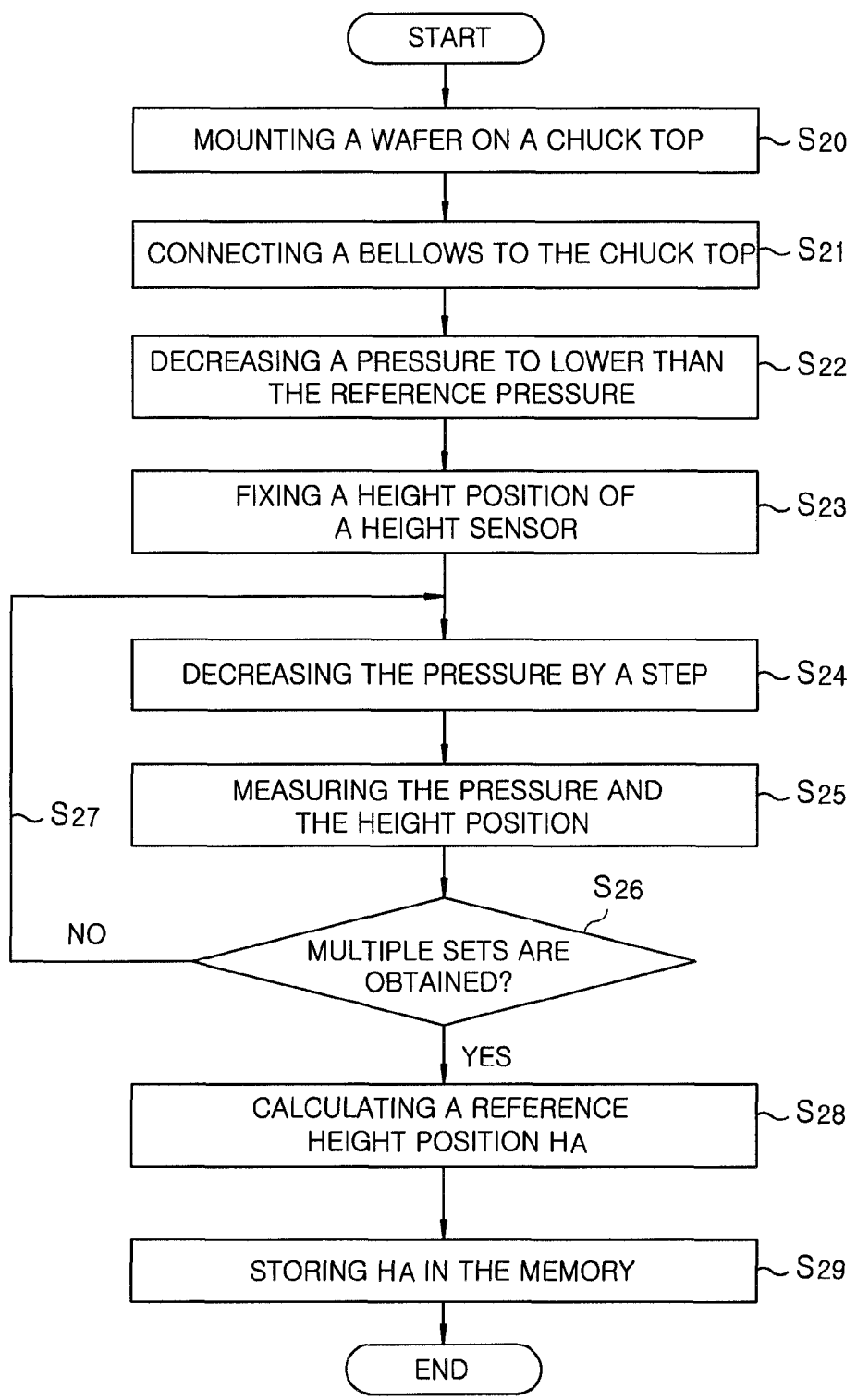
FIG. 10 is a flowchart showing a main sequence (especially, a control sequence of a controller) of a reference height position determining process in one example of the embodiment.
Figure 11:
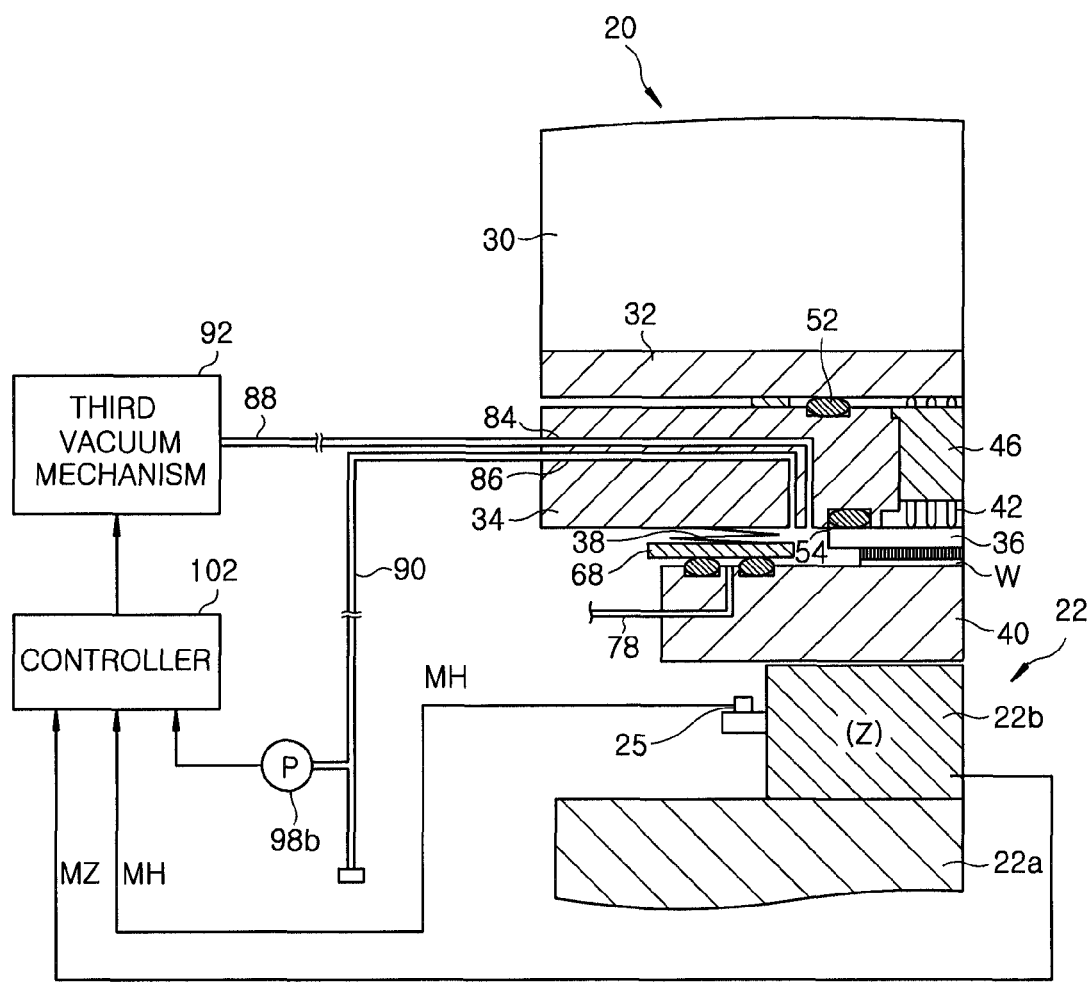
FIG. 11 shows states of main components in the reference height position determining process.

FIG. 10 shows a main sequence of the reference height position determining process (especially, a control sequence of the controller 102).

The reference height position determining process may be performed after the process of measuring the reference pressure or may be performed completely separately. In this example, there will be described the case of performing the reference height position determining process separately.

First, as in the case of wafer inspection, the wafer W is mounted on the chuck top 40 (step $S_{20}$) and the position alignment between the probe card 36 and the chuck top 40 is performed.

Next, the bellows 38 is connected to the chuck top 40 (step $S_{21}$). Then, the chuck top 40 is lifted by the Z-axis moving unit 22b of the moving table 22 to a height position where a proper press-contact state between the wafer W and the probe card 36 is obtained. Thereafter, the third vacuum mechanism 92 is switched ON to start the evacuation of the surrounding space 82 (step $S_{22}$). When the pressure in the surrounding space 82 reaches the reference pressure $P_A$, the Z-axis moving unit 22b is lowered to a height position downwardly separated from the chuck top 40 (within the distance measurement range of the height sensor 25). Then, the height position of the Z-axis moving unit 22b, i.e., the height position of the height sensor 25, is fixed (step $S_{23}$).

In a state where the height position of the height sensor 25 is fixed, the pressure in the surrounding space 82 is decreased from the reference pressure $P_A$ in a stepwise manner at a regular rate by the evacuation of the third vacuum mechanism 92. In each step, the pressure in the surrounding space 82 is measured by the pressure sensor 98B and the height position of the chuck top 40 is measured by the height sensor 25 (steps $S_{24} \rightarrow S_{25} \rightarrow S_{26} \rightarrow S_{27} \rightarrow S_{24}$ ... ). Accordingly, in a negative pressure range lower than the reference pressure $P_A$, there are obtained multiple sets $K_m(P_m, H_m)$ and $K_n(P_n, H_n)$ of the measured pressure in the surrounding space 82 and the measured height position of the chuck top 40 corresponding thereto (step $S_{26}$). The reference height position $H_A$ is calculated based on the multiple sets $K_m(P_m, H_m)$ and $K_n(P_n, H_n)$ of the measured pressure in the surrounding space and the measured height position of the chuck top, and the reference pressure $P_A$ (step $S_{28}$).

Figure 12:
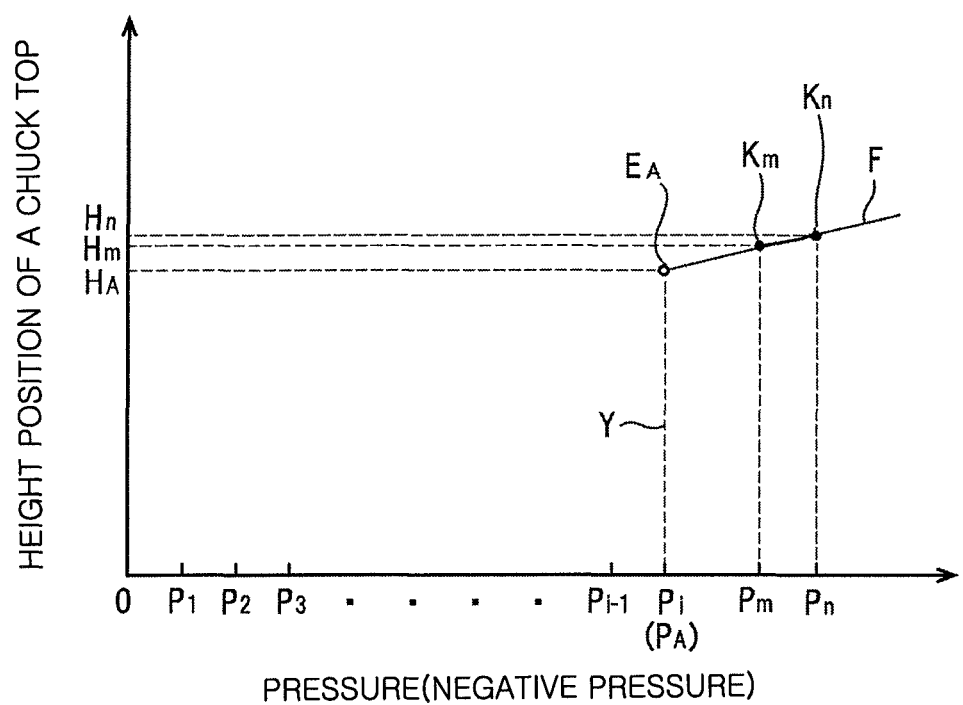
FIG. 12 is a graph for explaining a method for obtaining a reference height position in the reference height position determining process.

In the example shown in FIG. 12, there is an intersection point $E_A$ where a normal line Y vertically extending from the reference pressure $P_A$ crosses with a linear approximate curve F obtained by a least square method based on the multiple sets $K_m(P_m, H_m)$ and $K_n(P_n, H_n)$ of the measured pressure in the surrounding space and the measured height position of the chuck top. The height position of the intersection point $E_A$ is set to the reference height position $H_A$.

As the number of the measurement points $K_m, K_n, \ldots$ of the pressure in the surrounding space and the height position of the chuck top is increased, the accuracy of the inclination of the approximate linear approximate curve F and the accuracy of the reference height position $H_A$ are increased. However, if the height position of the chuck top 40 is excessively high, i.e., if the overdrive amount OD is considerably large, the elastic deformation of the contact probe 37 does not comply with the Hooke's law and the linear approximation of least square method is not satisfied. Accordingly, it is preferable to use, for the calculation of the reference height position $H_A$, the multiple sets of the measurement points $K_m, K_n, \ldots$ acquired in the linear area where the elastic deformation of the contact probe 37 complies with the Hooke's law. The controller 102 stores the calculated value (data) of the reference height position $H_A$ in the memory (step $S_{29}$).

Figure 13A:
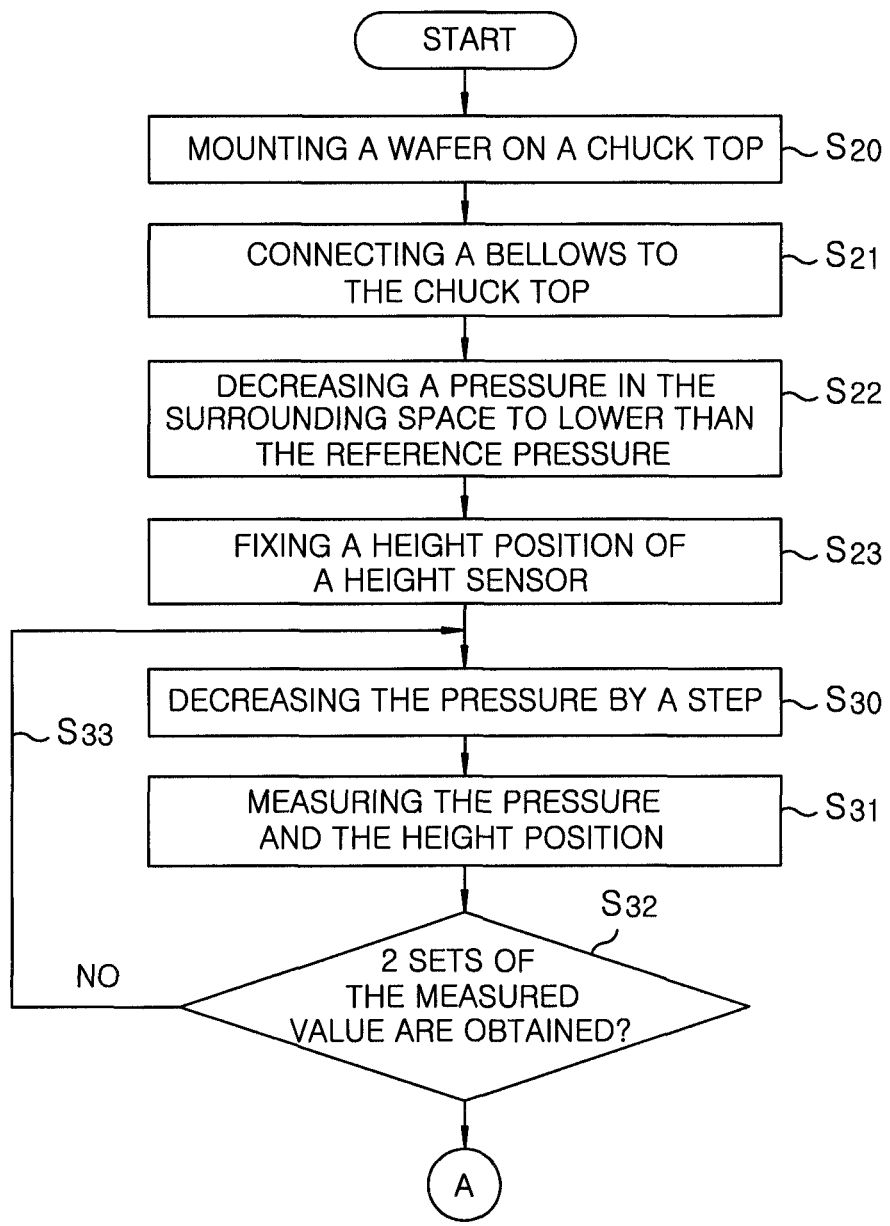
FIGS. 13A and 13B are a flowchart showing a main sequence (especially, a control sequence of a controller) of the reference height position determining process in another example.
Figure 13B:
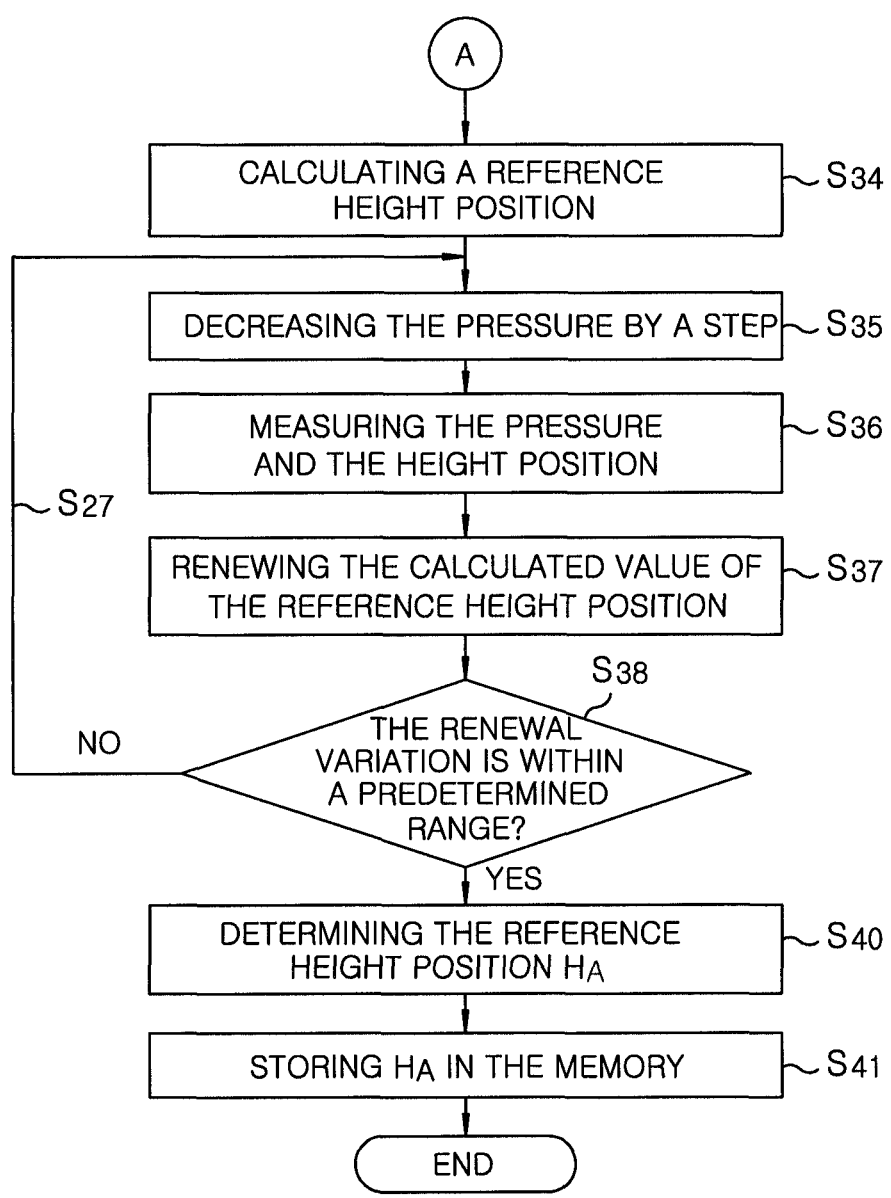
Figure 14:
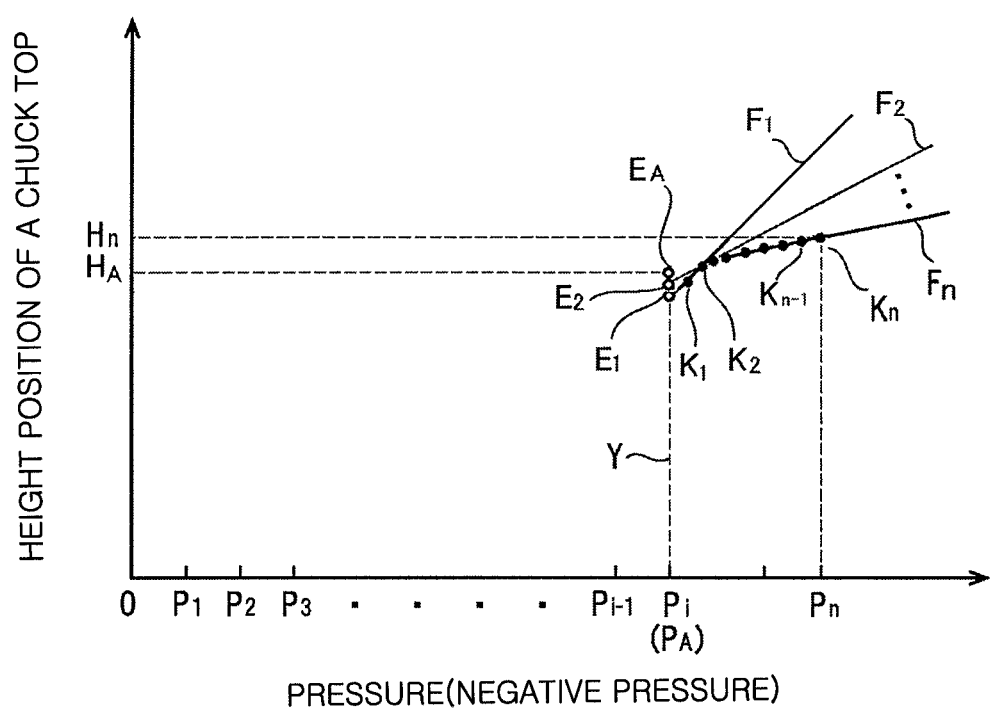
FIG. 14 is a graph for explaining another method for obtaining a reference height position in the reference height position determining process.

In another example, as shown in FIGS. 13A, 13B and 14, it is possible to employ a technique (steps $S_{30}$ to $S_{41}$) for renewing the calculated value of the reference height position $H_A$ by repeating the calculation of the linear approximate curve F and the reference height position $H_A$ whenever the measurement point K is added in the area of the negative pressure lower than the reference pressure $P_A$. This technique is suitable for the case where the number of measurement points K is increased in a stepwise manner from a measurement point $K_1$ close to the reference pressure $P_A$ toward a measurement point $K_n$ far from the reference pressure $P_A$. The calculated value of the reference height position $H_A$ is determined when the renewal variation thereof is within a predetermined range (steps $S_{35}$ to $S_{40}$).

[Process of Measuring Set Value of Pressure for Inspection]

Figure 15:
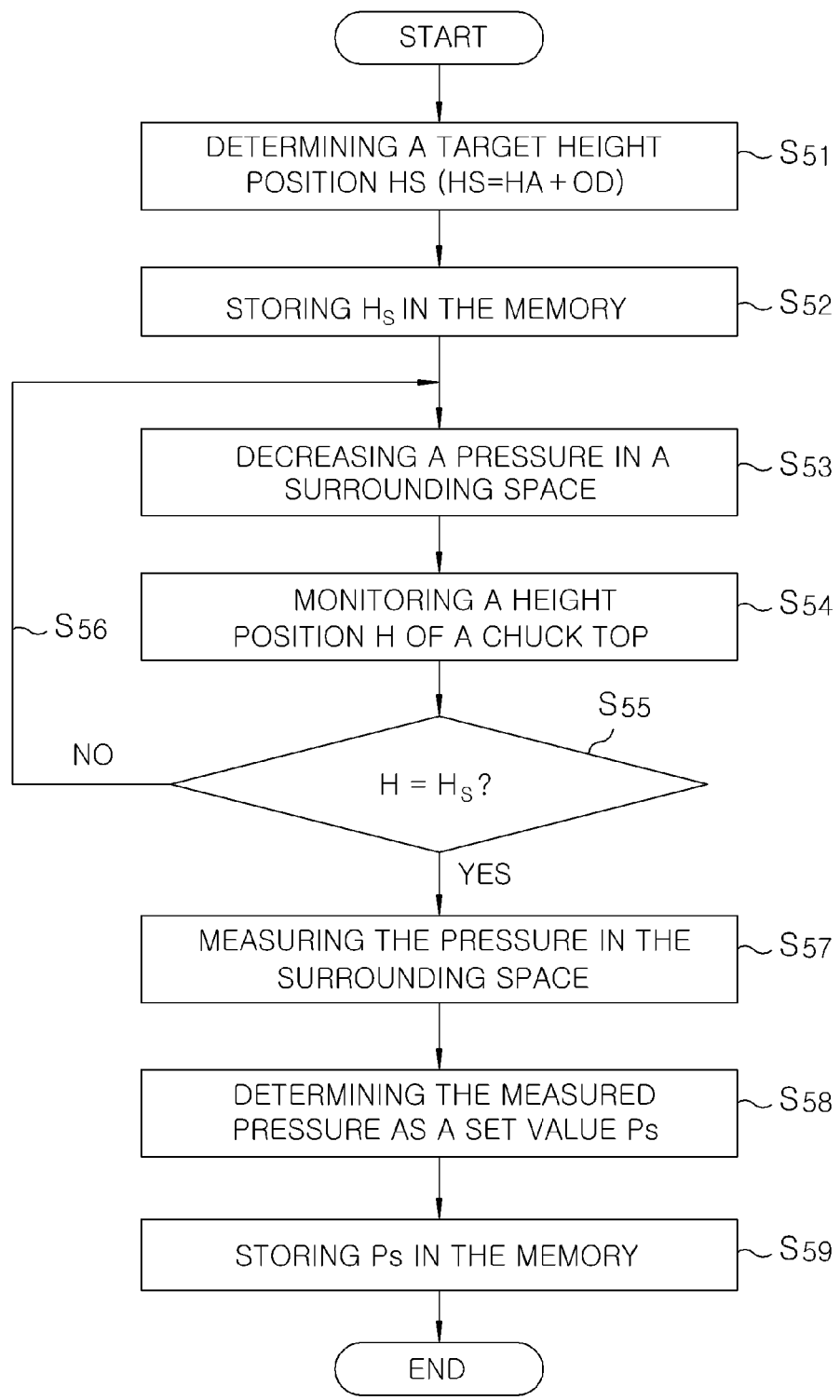
FIG. 15 is a flowchart showing a main sequence (especially, a control sequence of a controller) of a process of measuring a set value of a pressure for inspection according to an embodiment.

Hereinafter, the process of measuring the set value of the pressure for inspection will be described with reference to FIGS. 15 and 16. FIG. 15 shows a main sequence (especially, a control sequence of the controller 102) of the process of measuring the set value of the pressure for inspection.

The process of measuring the set value of the pressure for inspection (see FIG. 15) may be performed after the reference height position determining process or may be performed independently. In the following description, it is performed after the reference height position determining process (see FIG. 10 or 13).

The controller 102 determines the target height position $H_S$ ($H_S = H_A + OD$) of the chuck top 40 by adding the set value of the overdrive amount OD to the reference height position $H_A$ obtained by the reference height position determining process (step $S_{51}$). Then, the data of the target height position $H_S$ is stored in the memory (step $S_{52}$). The target height position $H_S$ corresponds to the height position for inspection of the chuck top 40 in the wafer inspection.

Next, the controller 102 performs the control of decreasing the pressure in the surrounding space 82, i.e., the control of lifting the chuck top 40 (steps $S_{53} \rightarrow S_{54} \rightarrow S_{55} \rightarrow S_{56} \rightarrow S_{53}$ ... ), until the height position H of the chuck top 40 becomes the same as the target height position $H_S$. More specifically, the controller 102 decreases the pressure in the surrounding space by the vacuum mechanism 92 while monitoring the height position H of the chuck top 40 by using the height sensor 25, fixes (maintains) the pressure in the surrounding space 82 to a level in which the height position H of the chuck top becomes the same as the target height position $H_S$, and measures the pressure in the surrounding space 82 at that time by the pressure sensor 98B (step $S_{57}$). The measured pressure is determined as the set value $P_S$ of the pressure for inspection (step $S_{58}$) and the value thereof (data) is stored in the memory (step $S_{59}$).

If the height position H of the chuck top 40 become higher than the target height position $H_S$ while the pressure in the surrounding space 82 is being decreased, the pressure in the surrounding space 82 is controlled to increase until the height position of the chuck top 40 ultimately becomes the same as the target height position $H_S$.

Figure 16A:
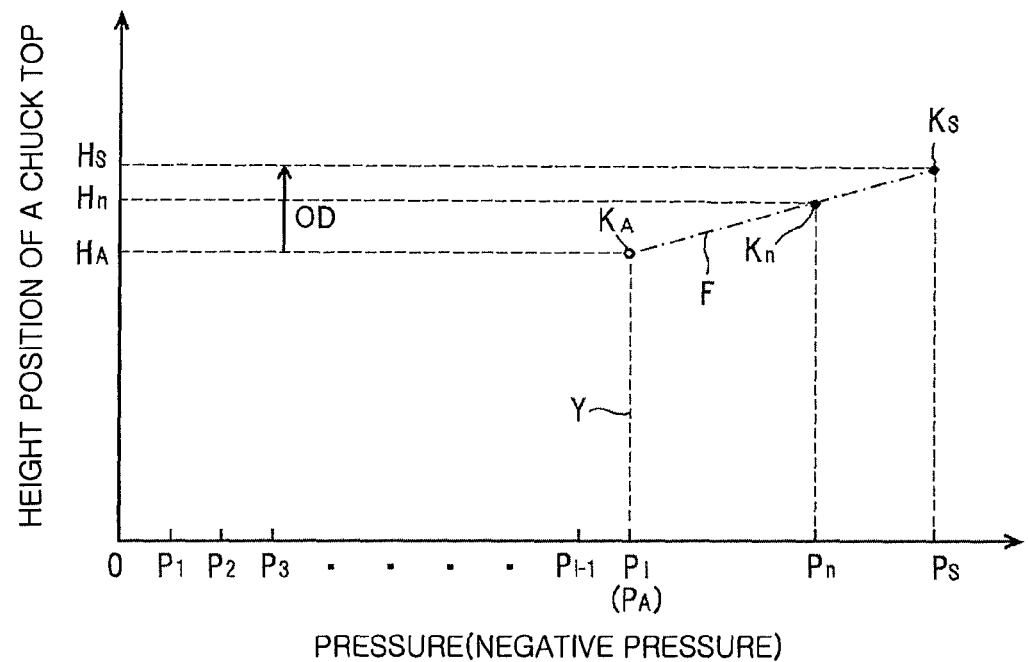
FIGS. 16A and 16B are graphs showing examples of a technique for determining a set value of a pressure for inspection in the process of measuring a set value of a pressure for inspection.
Figure 16B:
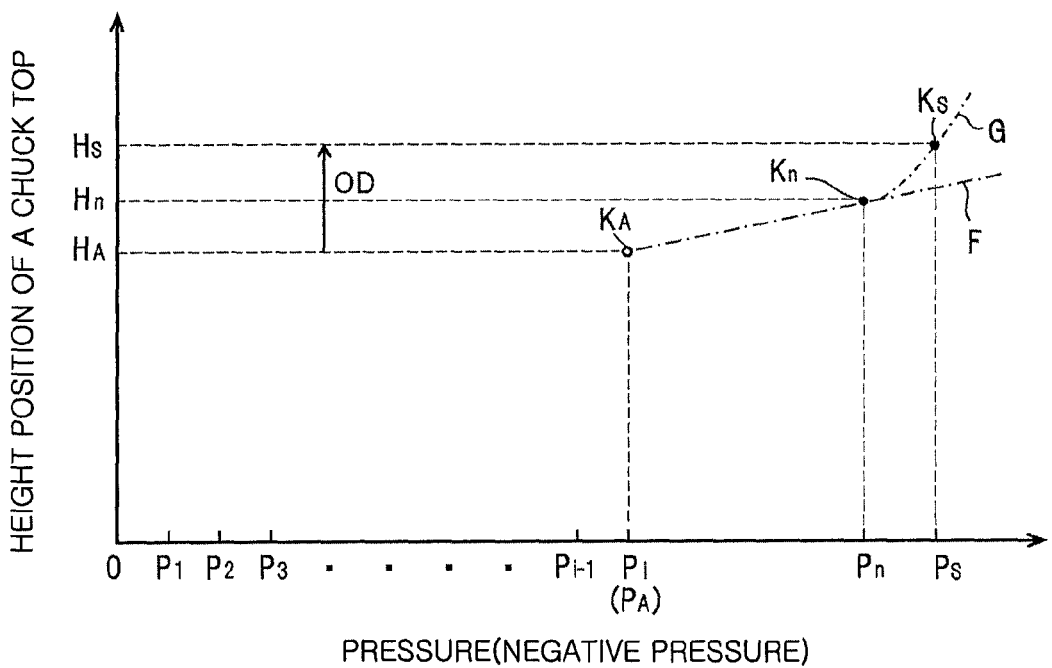

By measuring the set value of the pressure for inspection, even when the target height position $H_S$ of the chuck top 40 is located on an extended line of the linear approximate curve F used for obtaining the reference height position $H_A$ as shown in FIG. 16A and even when the target height position $H_S$ is deviated from the linear approximate curve F as shown in FIG. 16B, it is possible to obtain the accurate set value $P_S$ of the pressure in the surrounding space 82 which is required to maintain the chuck top 40 in a floating state at the target height position, i.e., the height position $H_S$ for inspection.

Generally, when the overdrive amount OD exceeds a certain value, the elastic deformation of the contact probe 37 which is caused by the press-contact with the wafer W does not follow the Hooke's law. As a consequence, the height position of the chuck top is exponentially increased with respect to the pressure in the surrounding space 82 as indicated by a dashed line G in FIG. 16B. In that case, if the set value $P_S$ for inspection corresponding to the target height position $H_S$ is calculated or estimated by using the linear approximate curve F and the set value $P_S$ used for the actual wafer inspection, then a problem occurs. In other words, after the chuck top 40 is lifted by the Z-axis moving unit 22b of the moving table 22 to the height position $H_S$ for inspection (i.e., after the preset overdrive amount is obtained), the vacuum mechanism 92 operates to depressurize the surrounding space 82 to the set value $P_S$ for inspection. As a consequence, the height position H of the chuck top 40 becomes higher than the height position $H_S$ for inspection, and the overdrive amount exceeds the set amount. As a result, the wafer inspection in which the preset overdrive amount is ensured cannot be performed, and the electrodes on the wafer W and the contact probes 37 may be damaged by the excessive contact pressing force.

In the present embodiment, the pressure in the surrounding space 82 (i.e., the set value of the pressure for inspection) $P_S$, which is required for maintaining the floating chuck top 40 at the target height position, i.e., the height position $H_S$ for inspection, is determined by the process of measuring the set value of the pressure for inspection. Hence, even if a certain value (especially, a comparatively large value) is selected as the set value of the overdrive amount OD, or even if the probe card 36 has a design error or a manufacturing error or an individual difference (variation), it is possible to stably and reliably obtain the state in which the probe card 36 and the wafer W are brought into press-contact with each other by the preset overdrive amount while maintaining the chuck top 40 in a floating state during the wafer inspection.

As described above, in the present embodiment, the set value of the pressure for wafer inspection, i.e., the set value $P_S$ of the vacuum pressure (the set value of the pressure for inspection) for obtaining a state in which the probe card 36 of the prober 20 and the wafer W are brought into press-contact with each other by the preset overdrive amount in the surrounding space 82, is determined by combining the process of measuring the reference pressure (see FIG. 7), the reference height position determining process (see FIG. 10 or 13), and the process of measuring the set value of the pressure for inspection (see FIG. 15).

In the actual wafer inspection, the chuck top 40 is lifted by the moving table 22 to the target height position $H_S$ ($H_S=H_A+OD$) in which the preset overdrive amount OD is added to the reference height position $H_A$. The reference height position $H_A$ is obtained when the probe card 36 and the wafer W are brought into contact with each other by an overdrive amount that is substantially zero. After the press-contact state is obtained, i.e., the probe card 36 and the wafer W are brought into press-contact with each other by the preset overdrive amount OD, the third vacuum mechanism 92 for maintaining an overdrive decreases the pressure in the surrounding space 82 to the set value $P_S$ of the pressure for inspection. Accordingly, even if the vacuum attractive force replaces the force of lifting the chuck top 40 by the moving table 22 to maintain the press-contact state, the overdrive amount is maintained at the set value OD without variation. Therefore, the inspection of the wafer W is normally performed. Further, the contact probes 37 of the probe card 36 or the electrodes on the surface of the wafer W are not damaged by the excessive pressing force exceeding the preset overdrive amount OD.

In the process of determining the set value of the pressure for inspection of the present embodiment, even if the probe card 36 has a design error or a manufacturing error or an individual difference (variation), the reliability of the wafer inspection or the stability of the jig or the workpiece is not affected.

[Other Embodiments or Modifications]

In the above embodiment, the set value $P_S$ of the pressure for inspection was measured. However, in case it is clear that the target height position $H_S$ exists in a linear region where the linear approximate curve F obtained by the reference height position determining process fits, it is possible to calculate or estimate the set value $P_S$ corresponding to the target height position $H_S$ on the linear approximate curve F.

In the above embodiment, the height sensor 25 for measuring the height position H of the chuck top 40 is installed at an upper portion of the Z-axis moving unit 22b of the moving table 22 which can access the bottom surface of the chuck top 40. However, the configuration and the installation position of the height sensor 25 are not limited thereto and may be variously modified.

Figure 17A:
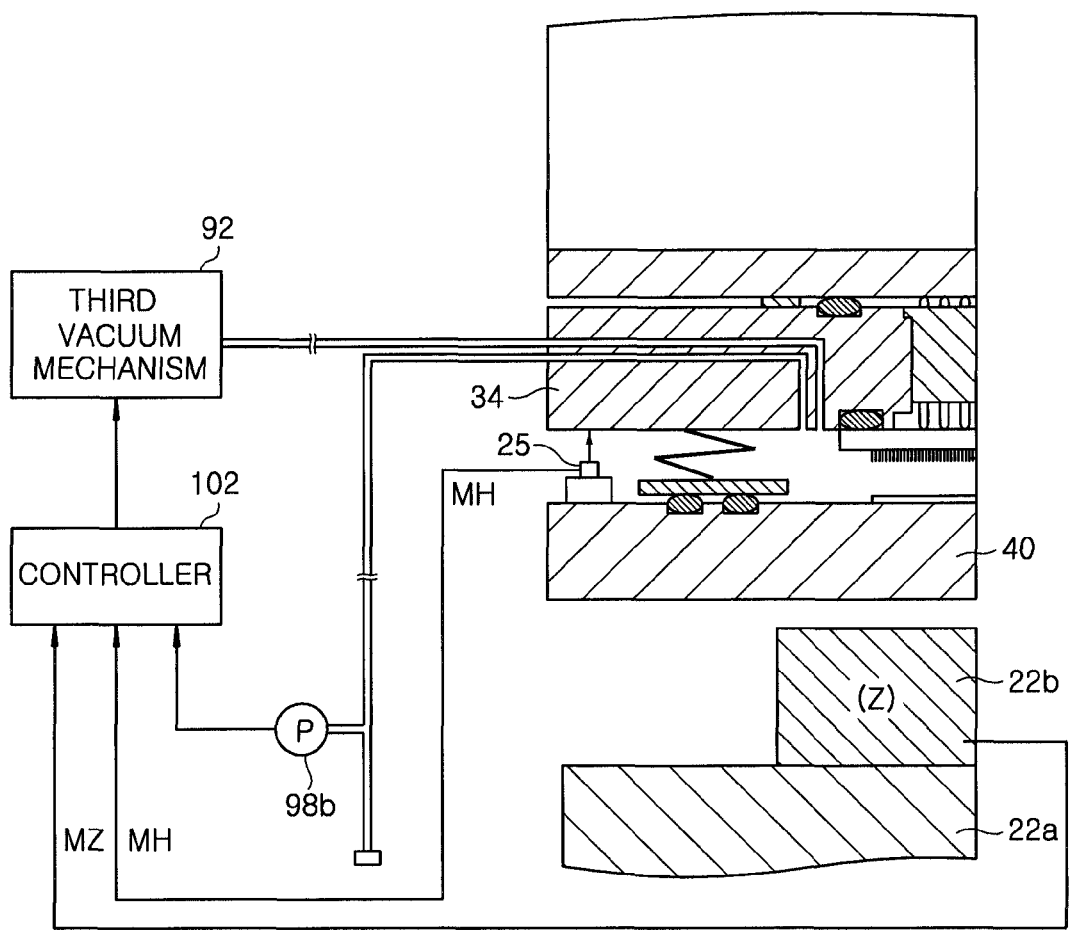
FIGS. 17A and 17B show modifications of installation locations of a height sensor.
Figure 17B:
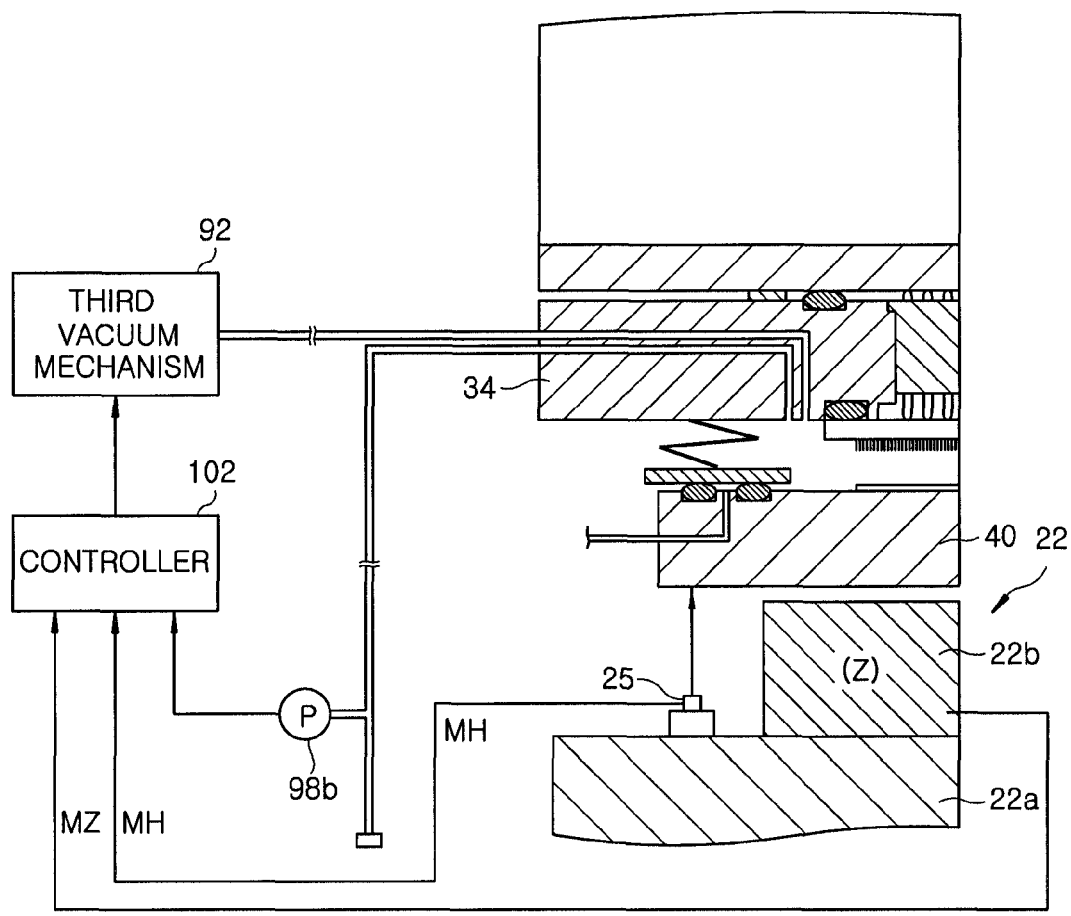
Figure 17C:
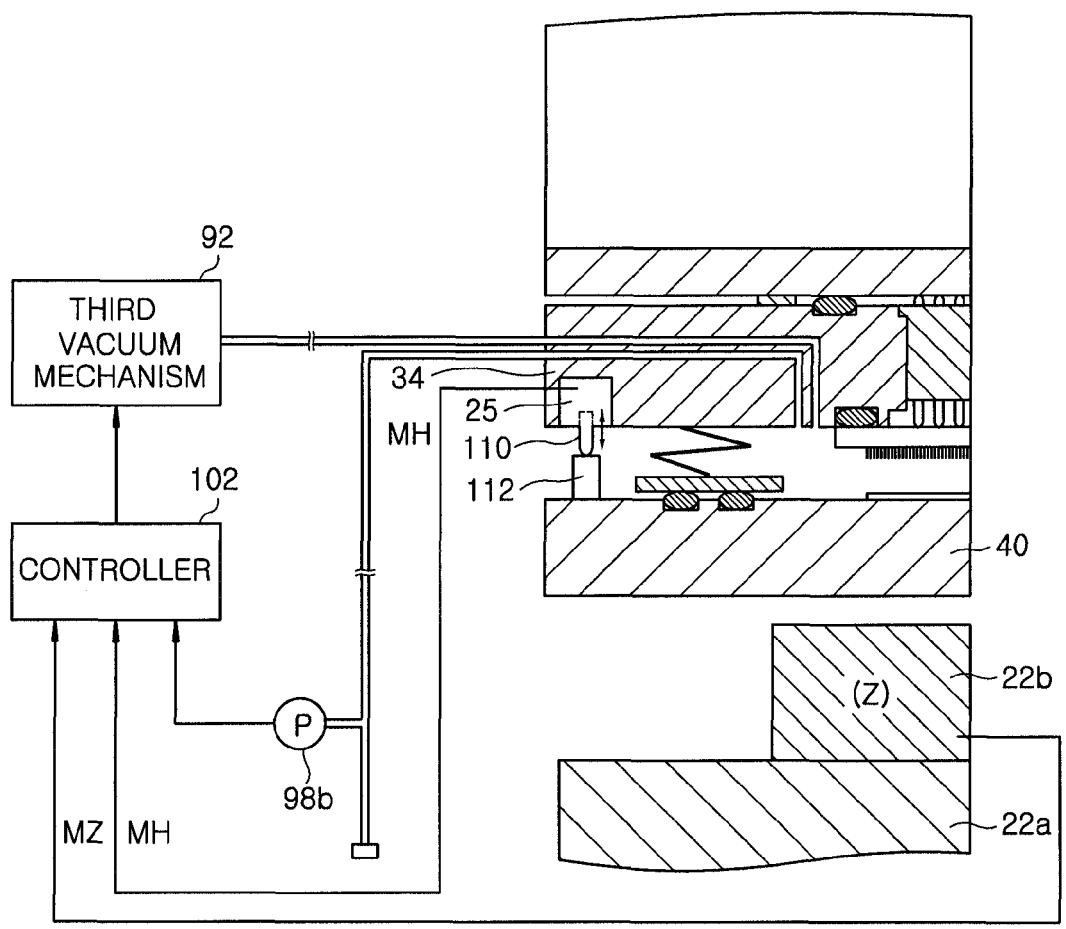
FIG. 17C shows a modification of a configuration and an installation location of the height sensor.

For example, as shown in FIG. 17A, it is also possible to install the height sensor 25 at the chuck top 40 and measure the distance (gap) between the chuck top 40 and the pogo frame 34 by the height sensor 25 to measure the height position of the chuck top 40 based on the measured distance. Although it is not illustrated, the height sensor 25 may be installed at the pogo frame 34. When an optical measurement range of the height sensor 25 is considerably large, the height sensor 25 may be provided on a top surface of the horizontal moving unit 22a of the moving table 22 as shown in FIG. 17B. Or, a camera for position alignment which has a distance measurement function may be used instead of the height sensor. The height sensor 25 may be configured as a contact-type distance sensor as shown in FIG. 17C. In the illustrated example, a dial gauge is used, for example. In that case, the height position of the chuck top 40 is measured when a lower part of a pressing unit 112 installed at a peripheral portion of a top surface of the chuck top 40 is brought into contact with a movable unit 110 of the contact-type height sensor 25.

While the disclosure has been shown and described with respect to the embodiments, it will be understood by those skilled in the art that various changes and modifications may be made without departing from the scope of the disclosure as defined in the following claims.

What is claimed is:

1. A method for determining a set value of a pressure for inspection in a wafer inspection apparatus including: a probe card having a plurality of contactors to be respectively brought into contact with a plurality of electrodes formed on a surface of a wafer as an inspection target; a movable chuck top configured to mount the wafer thereon to face the probe card; and a vacuum mechanism configured to control a pressure in a surrounding space sealable between the chuck top and the probe card to a predetermined set value of a negative pressure for inspection in order to generate or maintain a press-contact state between the probe card and the wafer by a predetermined pressing force, the method comprising the steps of:

(a) evacuating the surrounding space by the vacuum mechanism and measuring, as a reference pressure, a highest negative pressure in the surrounding space which is obtained when the chuck top floats;

(b) obtaining, as a reference height position, a height position of the chuck top which corresponds to the reference pressure; and (c) decreasing a pressure in the surrounding space to a level lower than the reference pressure, measuring the pressure in the surrounding space when the chuck top reaches a target height position obtained by adding a preset overdrive amount for the press-contact state between the probe card and the wafer to the reference height position, and setting the measured pressure as the set value of the pressure for inspection.

2. The method of claim 1, wherein the step (a) includes the steps of:
- (a-1) providing the chuck top at a first height position below the probe card with a gap therebetween; and
- (a-2) measuring a pressure in the surrounding space at a time when the chuck top floats from the first height position by gradually decreasing the pressure in the surrounding space using the vacuum mechanism, and setting the measured pressure as the reference pressure.

3. The method of claim 2, wherein the step (a-2) includes the steps of:
- (a-2-1) decreasing the pressure in the surrounding space in a stepwise manner
- (a-2-2) measuring the pressure in the surrounding space each time;
- (a-2-3) determining whether or not the chuck top has floated from the first height position; and
- (a-2-4) setting the pressure measured when it is first determined that the chuck top has floated from the first height position as the reference pressure.

4. The method of claim 3, wherein the step (a-2-3) includes determining based on an output signal of a noncontact type or contact type sensor provided below the chuck top with a gap therebetween.

5. The method of claim 4, wherein the sensor is mounted on an elevation mechanism for vertically moving the chuck top while supporting the chuck top from below.

6. The method of claim 3, wherein the step (a-2-3) includes determining based on an output signal of a noncontact type or contact type sensor attached to a holding member for holding the probe card.

7. The method of claim 1, wherein the step (a) is executed in a state where the wafer is not mounted on the chuck top.

8. The method of claim 1, wherein the step (b) includes the steps of:
- (b-1) acquiring multiple sets of a measured pressure in the surrounding space in a negative pressure range lower than the reference pressure and a measured height position of the chuck top, which corresponds to the measured pressure; and
- (b-2) calculating the height position of the chuck top corresponding to the reference pressure based on the multiple sets of the measured pressure and the measured height position and setting the calculated height position as the reference height position.

9. The method of claim 8, wherein the step (b-1) includes the steps of:
- (b-1-1) lifting the chuck top, in a state where the surrounding space is open to the atmosphere, from a second height position where the chuck top is separated from the probe card to a third height position where the probe card and the wafer are brought into proper press-contact with each other;
- (b-1-2) decreasing the pressure of the surrounding space by the vacuum mechanism;
- (b-1-3) releasing a pressing force applied to the chuck top after the pressure in the surrounding space becomes lower than the reference pressure; and
- (b-1-4) measuring, at a plurality of measurement points, the pressure in the surrounding space and the height position of the chuck top while varying the pressure in the surrounding space in the negative pressure range lower than the reference pressure.

10. The method of claim 9, wherein in the step (b-1-1), the third height position is higher than the reference height position.

11. The method of claim 9, wherein whenever in the step (b-2) the pressure in the surrounding space and the height position of the chuck top are newly obtained, and the reference height position is recalculated.

12. The method of claim 8, wherein in the step (b-1), the height position of the chuck top is measured by using a noncontact type or contact type sensor provided below the chuck top with a gap therebetween.

13. The method of claim 12, wherein the sensor is mounted on an elevation mechanism for vertically moving the chuck sop from below.

14. The method of claim 8, wherein in the step (b-1), the height position of the chuck top is measured by using a noncontact type or contact type sensor attached to a holding member for holding the probe card.

\* \* \* \* \*